(12) United States Patent
Hill

(10) Patent No.: US 6,650,419 B2
(45) Date of Patent: Nov. 18, 2003

(54) INTERFEROMETRIC APPARATUS FOR PRECISION MEASUREMENT OF ALTITUDE TO A SURFACE

(75) Inventor: Henry Allen Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 0 days.

(21) Appl. No.: 09/852,898

(22) Filed: May 10, 2001

(65) Prior Publication Data

US 2001/0046053 A1 Nov. 29, 2001

Related U.S. Application Data

(60) Provisional application No. 60/204,860, filed on May 17, 2000, and provisional application No. 60/223,523, filed on Aug. 7, 2000.

(51) Int. Cl.[7] .................................................. G01B 9/02
(52) U.S. Cl. ....................................... 356/500; 356/493
(58) Field of Search ................................ 356/500, 510, 356/486, 487, 493, 498

(56) References Cited

U.S. PATENT DOCUMENTS 5,187,543 A    2/1993   Ebert
5,757,160 A    5/1998   Kreuzer
6,020,964 A    2/2000   Loopstra et al. ............ 356/510

Primary Examiner—Samuel A. Turner
(74) Attorney, Agent, or Firm—Francis J. Caufield

(57) ABSTRACT

Interferometric apparatus for measuring changes in altitude between a surface and a datum line where the apparatus comprises a dimensionally stable metrology frame and the datum line is defined in an object mounted for nominally plane translation with respect to the metrology frame in at least two orthogonal directions while experiencing relatively smaller changes in altitude in a direction nominally normal to at least two orthogonal directions. An elongated reflector is mounted with respect to either the metrology frame or the object to provide the surface, and at least one interferometer system is mounted at least in part on object for movement therewith. The interferometer system is structured to provide a measurement beam that travels along at least one optical path to and from the elongated reflector to provide a signal containing information that varies in accordance with changes in altitude between the surface and the datum line as the object moves, and is configured so that the signal is insensitive to variations in angular rotation of the object at least about one of the two orthogonal directions.

22 Claims, 26 Drawing Sheets

INTERFEROMETRIC APPARATUS FOR PRECISION MEASUREMENT OF ALTITUDE TO A SURFACE

CROSS-REFERENCE TO RELATED APPLICATION

This application claims priority from U.S. Provisional Patent Application No. 60/204,860 filed on May 17, 2000 and U.S. Provisional Patent Application No. 60/223,523 filed on Aug. 7, 2000, the contents of both of which are incorporated herein by reference in their entirety.

BACKGROUND OF THE INVENTION

This invention in general relates to interferometry and in particular to interferometric apparatus and methods by which the altitude between a datum surface and a referent surface may be measured as at least part of the surfaces may be moving relative to one another.

Interferometry is a well established metrology used extensively in microfabrication processes to measure and control a host of critical dimensions. It is especially important in manufacturing semiconductors and the like where requirements for precision are 10 to 40% better than critical dimensions of 0.1 μm or below.

Integrated circuits made of semiconductor materials are constructed by successively depositing and patterning layers of different materials on a silicon wafer while it typically resides in a nominally flat exposure plane having Cartesian x-y coordinates with a normal z-direction. The patterning process consists of combinations of exposure and development of photoresist followed by etching and doping of the underlying layers and then deposition of another layer. This process results in a complex and, on the scale of microns, very nonhomogeneous material structure on the wafer surface.

Typically each wafer contains multiple copies of the same pattern called "fields" arrayed on the wafer in a nominally rectilinear distribution known as the "grid." Often, but not always, each field corresponds to a single "chip."

The exposure process consists of projecting the image of the next layer pattern onto (and into) the photoresist that has been spun onto the wafer. For the integrated circuit to function properly each successive projected image must be accurately matched to the patterns already on the wafer. The process of determining the position, orientation, and distortion of the patterns already on the wafer, and then placing them in the correct relation to the projected image, is termed "alignment." The actual outcome, i.e., how accurately each successive patterned layer is matched to the previous layers, is termed "overlay."

In general, the alignment process requires both translational and rotational positioning of the wafer and/or the projected image as well as some distortion of the image to match the actual shape of the patterns already present. The fact that the wafer and the image need to be positioned correctly to get one pattern on top of the other is obvious. Actual distortion of the image is often needed as well. Other effects, such as thermal and vibration, may require compensation as well.

The net consequence of all this is that the shape of the first-level pattern printed on the wafer is not ideal and all subsequent patterns must, to the extent possible, be adjusted to fit the overall shape of the first-level printed pattern. Different exposure tools have different capabilities to account for these effects, but, in general, the distortions or shape variations that can be accounted for include x and y magnification and skew. These distortions, when combined with translation and rotation, make up the complete set of linear transformations in the plane.

Since the problem is to successively match the projected image to the patterns already on the wafer, and not simply to position the wafer itself, the exposure tool must effectively be able to detect or infer the relative position, orientation, and distortion of both the wafer patterns themselves and the projected image.

It is difficult to directly sense circuit patterns themselves, and therefore, alignment is accomplished by adding fiducial or "alignment marks" to the circuit patterns. These alignment marks can be used to determine the reticle position, orientation, and distortion and/or the projected image position, orientation, and distortion. They can also be printed on the wafer along with the circuit pattern and hence can be used to determine the wafer pattern position, orientation, and distortion. Alignment marks generally consist of one or more clear or opaque lines on the reticle, which then become "trenches" or "mesas" when printed on the wafer. But more complex structures such as gratings, which are simply periodic arrays of trenches and/or mesas, and checkerboard patterns are also used. Alignment marks are usually located either along the edges of "kerf" of each field or a few "master marks" are distributed across the wafer. Although alignment marks are necessary, they are not part of the chip circuitry and therefore, from the chip maker's point of view, they waste valuable wafer area or "real estate." This drives alignment marks to be as small as possible, and they are often less than a few hundred micrometers on a side.

Alignment sensors are incorporated into the exposure tool to "see" alignment marks. Generally there are separate sensors for the wafer, the reticle, and/or the projected image itself. Depending on the overall alignment strategy, these sensors may be entirely separate systems or they may be effectively combined into a single sensor. For example, a sensor that can see the projected image directly would nominally be "blind" with respect to wafer marks and hence a separate wafer sensor is required. But a sensor that "looks" at the wafer through the reticle alignment marks themselves is essentially performing reticle and wafer alignment simultaneously and hence no separate reticle sensor is necessary. Note that in this case the positions of the alignment marks in the projected image are being inferred from the positions of the reticle alignment marks and a careful calibration of reticle to image positions must have been performed before the alignment step.

Furthermore, as implied above, essentially all exposure tools use sensors that detect the wafer alignment marks optically. That is, the sensors project light at one or more wavelengths onto the wafer and detect the scattering/diffraction from the alignment marks as a function of position in the wafer plane. Many types of alignment sensor are in common use and their optical configurations cover the full spectrum from simple microscopes to heterodyne grating interferometers. Also, since different sensor configurations operate better or worse on given wafer types, most exposure tools carry more than one sensor configuration to allow for good overlay on the widest possible range of wafer types.

The overall job of an alignment sensor is to determine the position of each of a given subset of all the alignment marks on a wafer in a coordinate system fixed with respect to the exposure tool. These position data are then used in either of two generic ways, termed "global" and "field-by-field," to perform alignment. In global alignment, the marks in only a few fields are located by the alignment sensor(s) and the data are combined in a best-fit sense to determine the optimum alignment of all the fields on the wafer. In field-by-field alignment the data collected from a single field are used to align only that field. Global alignment is usually both faster, because not all the fields on the wafer are located, and less sensitive to noise, because it combines all the data together to find a best overall fit. But, since the results of the best fit are used in a feed-forward or dead reckoning approach, it does rely on the overall optomechanical stability of the exposure tool.

Alignment is generally implemented as a two-step process; that is, a fine alignment step with an accuracy of tens of nanometers follows an initial coarse alignment step with an accuracy of microns, and alignment requires positioning the wafer in all six degrees of freedom: three translation and three rotation. But adjusting the wafer so that it lies in the projected image plane, i.e., leveling and focusing the wafer, which involves one translational degree of freedom (motion along the optic axis, the z-axis or a parallel normal to the x-y wafer orientation) and two rotational degrees of freedom (orienting the plane of the wafer to be parallel to the projected image plane), is generally considered separate from alignment. Only in-plane translation (two degrees of freedom) and rotation about the projection optic axis (one degree of freedom) are commonly meant when referring to alignment. The reason for this separation in nomenclature is the difference in accuracy required. The accuracy required for in-plane translation and rotation generally needs to be on the order of several tens of nanometers or about 20 to 30% of the minimum feature size or critical dimension (CD) to be printed on the wafer. Current state-of-the-art CD values are on the order of several hundred nanometers and thus the required alignment accuracy is less than 100 nm. On the other hand, the accuracy required for out-of-plane translation and rotation is related to the total usable depth of focus of the exposure tool, which is generally close to the CD value. Thus, out-of-plane focusing and leveling the wafer require less accuracy than in-plane alignment. Also, the sensors for focusing and leveling are usually completely separate from the "alignment sensors" and focusing and leveling do not usually rely on patterns on the wafer. Only the wafer surface or its surrogate needs to be sensed. Nevertheless, this is still a substantial task requiring, among other things, precise knowledge about the vertical position (the altitude) of the optical projection system above the wafer. To achieve this vertical position measurement, interferometers are known as that described, for example, in U.S. Pat. No. 6,020,964. This interferometer, however, appears to suffer from a measurement beam not being parallel with an associated reference beam after only a single measurement beam pass to a measurement object, a significant shear of the interferometer's reference and measurement beams at the detector due to non-parallelism of the measurement and associated reference beams after a single pass to the measurement object for converting information carried on optical signals to electrical form, and from environmental and air turbulence effects in portions of the measurement beam paths not directly associated with the altitude.

Accordingly, it is a major object of the present invention to provide interferometric apparatus and methods by which the altitude of photolithographic optical system above a wafer may be precisely measured with minimal beam shear due to non-parallelism of a measurement and associated reference beams after a single pass to the measurement object and with reduced non-parallelism of the measurement and associated reference beams after a single pass to the measurement object.

It is another object of the present invention to provide interferometric apparatus and methods by which the altitude of photolithographic optical system above a wafer may be precisely measured with minimal beam shear and with reduced non-parallelism of the measurement and associated reference beams after a single pass to the measurement object while being sensitive to changes in the index of refraction due to environmental and turbulence effects of a medium only along the altitude portion of a measurement path and not sensitive to changes in the index of refraction due to environmental and turbulence effects of a medium only along other portions of a measurement.

It is another object of the of the present invention to provide interferometric apparatus and methods by which the altitude of photolithographic optical system above a wafer may be precisely measured by looking down on the wafer from the optical system or up from the wafer to the optical system.

It is another object of the of the present invention to provide interferometric apparatus and methods by which the altitude of photolithographic optical system above a wafer may be precisely measured with x and y translations of the wafer not introducing any Doppler shifts in the frequency of an optical signal carrying altitude information.

Other objects of the present invention will, in part, be obvious and will, in part, appear hereinafter when reading the following detailed description in conjunction with the drawings.

SUMMARY OF THE INVENTION

Interferometric apparatus for measuring changes in altitude between a surface and a datum line where the apparatus comprises a dimensionally stable metrology frame and the datum line is defined in an object mounted for nominally plane translation with respect to the metrology frame in at least two orthogonal directions while experiencing relatively smaller changes in altitude in a direction nominally normal to said at least two orthogonal directions. Elongated reflector means are mounted with respect to either the metrology frame or the object to provide the surface, and at least one interferometer system is mounted at least in part on said object for movement therewith. The interferometer system is structured to provide a measurement beam that travels along at least one optical path to and from the elongated reflector means to provide a signal containing information that varies in accordance with changes in altitude between the surface and the datum line as the object moves, and is configured so that the signal is insensitive to variations in angular rotation of the object at least about one of the two orthogonal directions.

The interferometric apparatus comprises a dimensionally stable metrology frame and means for defining a datum line in an object mounted for nominally plane translation with respect to said metrology frame in at least two orthogonal directions while experiencing relatively smaller changes in altitude in a direction nominally normal to the two orthogonal directions. Elongated reflector means are provided and are mounted with respect to the metrology frame to provide the surface. At least one interferometer system is mounted at least in part on the object for movement therewith, and the interferometer system is structured to provide a measurement beam that travels along at least one optical path to and from the elongated reflector means to provide a signal containing information that varies in accordance with changes in altitude between the surface and the datum line as the object moves. The interferometer system is configured so that the signal is insensitive to variations in angular rotation of the object at least about one of the two orthogonal directions. Means are included for receiving the signal and determining the altitude therefrom. The interferometers and reflecting means may be located on or off the stage, the apparatus may be upward or downward looking depending on whether the principal perspective is from the stage or the metrology frame.

BRIEF DESCRIPTION OF THE DRAWINGS

The structure, operation, and methodology of the invention, together with other objects and advantages thereof, may best be understood by reading the detailed description in connection with the drawings in which each part has an assigned numeral that identifies it wherever it appears in the various drawings and wherein:

FIG. 2b is diagrammatic elevational view of a variant of the embodiment of FIG. 2a;

FIG. 3b is diagrammatic perspective view of a variant of the second embodiment of FIG. 3a;

FIG. 13b is a variant of the embodiment of FIG. 13a; and

DESCRIPTION OF INVENTION

This invention in general relates to interferometry and in particular to interferometric apparatus and methods by which the altitude above a datum surface to a referent line may be measured as at least part of the surfaces may be moving relative to one another. More particularly, seven embodiments and one variant of the invention are described which are particularly suitable for use in measuring the altitude of the optical system with respect to the wafer surface location in a projection photolithographic apparatus to optimize focus.

Figure 1:
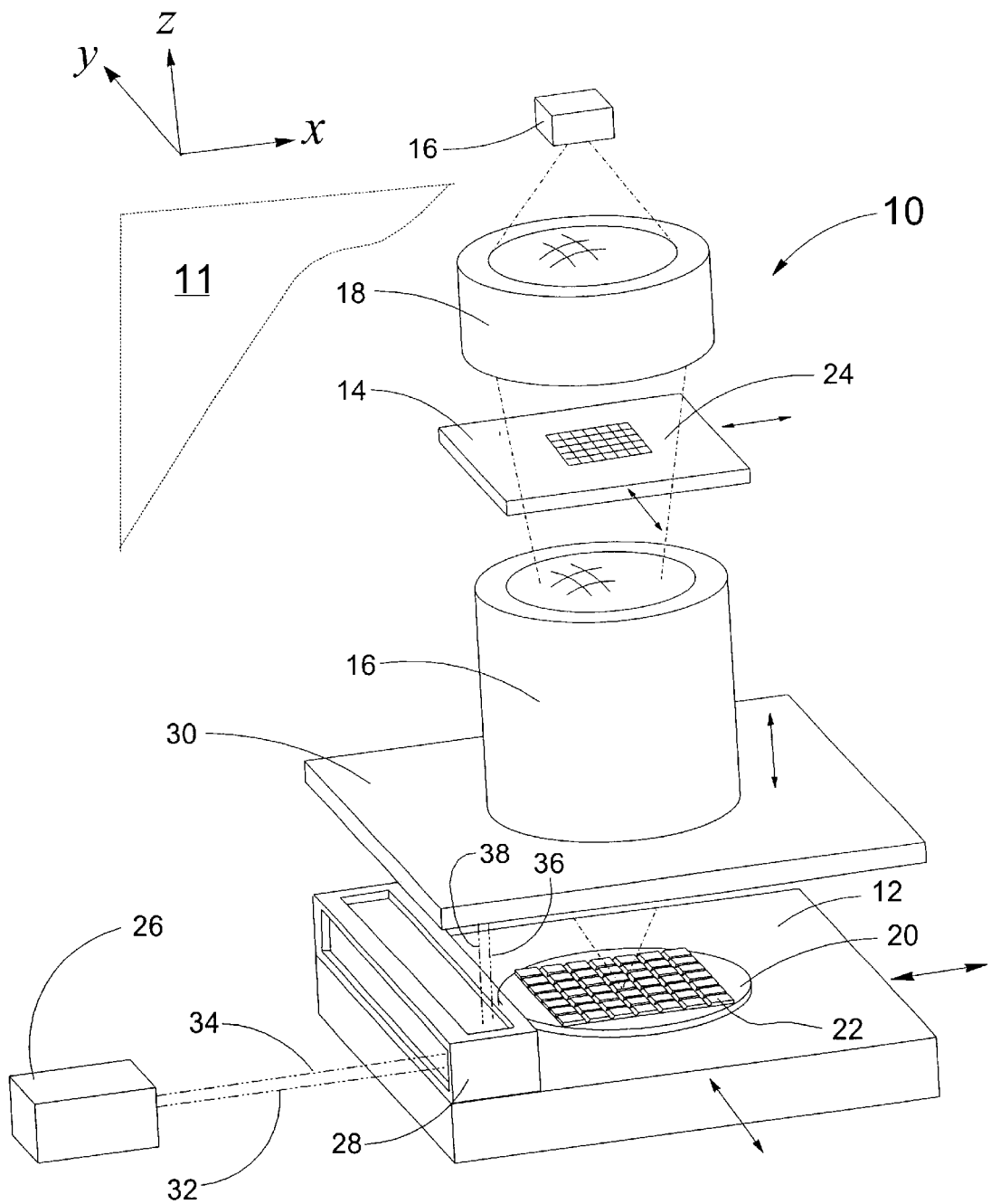
FIG. 1 is a highly diagrammatic perspective view of a photolithographic stepper or scanning system in which the invention may be incorporated for the precision measurement of the altitude of its optical projection system with respect to the surface of the wafer.

As is well-known, optical lithography involves the creation of relief image patterns through the projection of radiation within or near the ultraviolet (UV)-visible portion of the electromagnetic spectrum and has been extensively used in the making of microcircuit patterns for semiconductor devices. Current projection techniques allow resolutions below 0.1 $\mu$m. Diagrammatically shown in FIG. 1 (designated at 10) is a generic photolithographic projection system in which the various embodiments of the invention may be incorporated. While simplified, system is shown in sufficient detail to provide an understanding of how the embodiments of the invention can provide information about critical dimensional relationships in system 10 as it is employed to fabricate semiconductor devices. As seen in FIG. 1, system 10 is a projection type imaging system having as its major components a wafer stage 12, a mask stage 14, an objective lens 16 in the intervening space between wafer stage 12 and mask stage 14, and an illumination system comprising a source 16 and condenser 18.

Wafer stage 12 is equipped for holding a wafer 20, and in some cases is provided with a shuttle transport arrangement for handling multiple wafers. Formed on wafer 20 is a relief pattern 22 comprising chips having features typically below 0.1 $\mu$m. Relief pattern 22 is formed on wafer 20 by forming multiple images of one or more masks 24 carried on mask stage 14. In this connection, mask stage 24 may be moved in and out of a park position located in the illumination provided by the illumination system while the wafer stage is stationary or may be scanned across the mask stage plane while the wafer stage is synchronously moved in a scanning system.

The optical configuration for objective 16 most closely resembles a microscope system which allows for the formation of aerial images of diffraction-limited resolution at high numerical apertures. The illumination system typically focuses an image of the source into the entrance pupil of the objective lens to provide maximum uniformity at the mask plane. The x and y positions of the wafer and mask stages, along with their angular relationships with respect to global coordinates and each other are measured with well-known interferometers (not shown) but of the type shown and described in, for example, "Differential Interferometer Arrangements for Distance and Angle Measurements: Principles, Advantages, and Applications, C. Zanoni, VDI Berichte NR. 749, (1989).

Apart from the motion of the stages, the remainder of the major components of system are typically held in a rigid metrology or space frame 11 (shown in phantom) that is thermally stable and mechanically isolated from otherwise moveable components whose positions and movements need to be precisely controlled. Metrology frame 11 serves also to support the various components including the x and y translation stages. In addition to the location and movement of the mask and wafer stages with respect to one another and the imaging system, it is also often required to measure the vertical separation or altitude between the wafer stage and the objective 16 to optimize focus to provide for focal positions that will result in the best replication of mask features in the wafer. To accomplish this, the present invention utilizes two modules 26 and 28 for measuring altitude. In this case the altitude is the vertical separation between module 28 and a referent plate 30 associated with the objective 16. Module 26 is mounted off stage while module 28 is mounted on the wafer stage 12. As will be seen, modules 26 and 28 may exist in a variety of configurations having components that perform different functions.

Figure 2A:
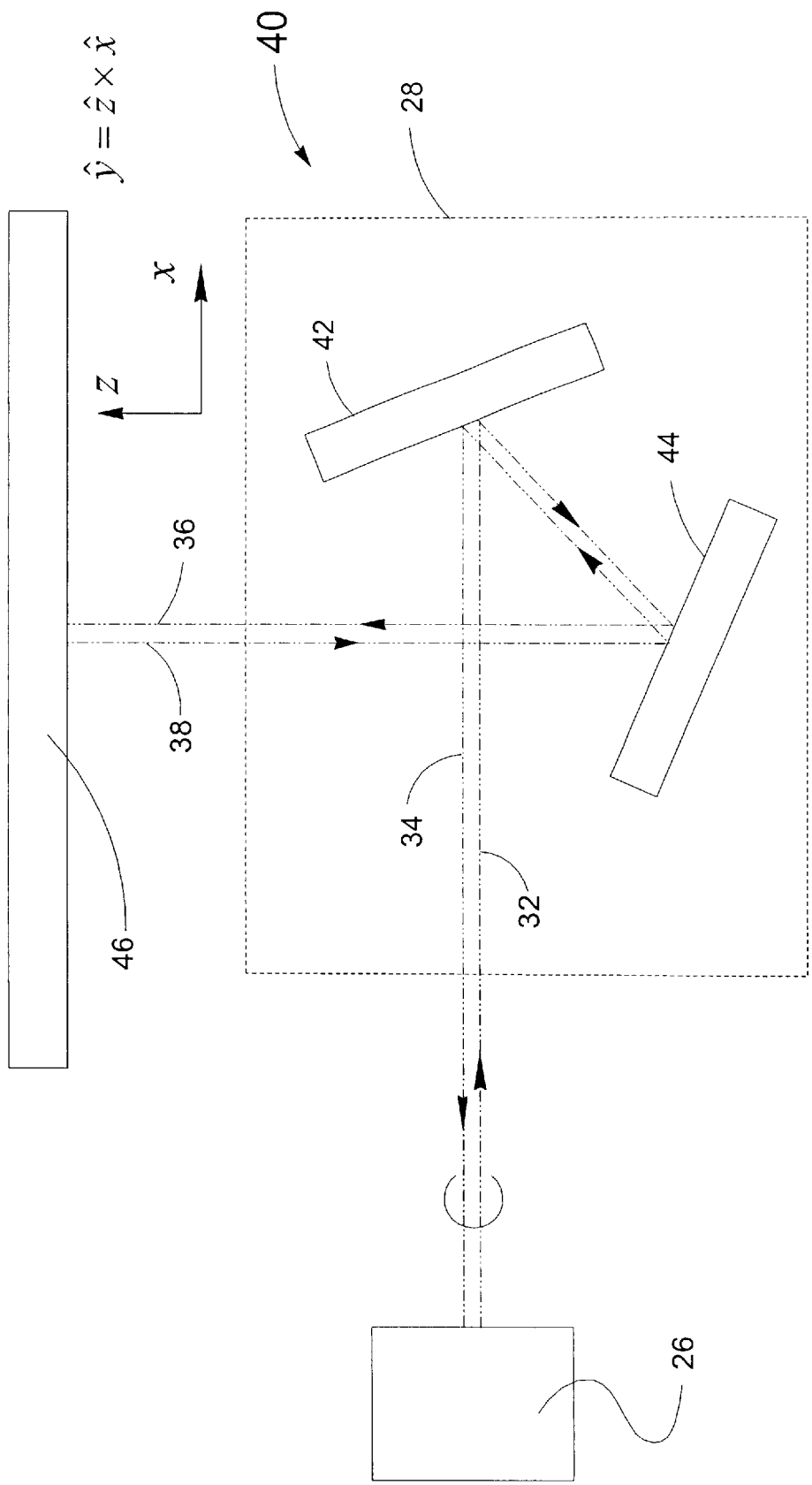
FIG. 2a is diagrammatic elevational view (taken in the plane of the paper of FIG. (1) of a first embodiment of the invention employing a stage mounted open elongated penta prism in conjunction with an off-stage mounted elongated planar mirror for measuring the altitude of a datum line associated with the optical projection system of a photolithographic stepper with respect to the wafer plus the distance from an off-stage interferometer to the point from which the altitude is measured (z+x)

Referring now to FIG. 2a, there is shown in a diagrammatic elevational view (taken in the plane of the paper of FIG. 1) a first embodiment of the invention designated generally as subsystem 40. Subsystem 40 comprises a stage mounted open elongated Penta prism formed of mirrors 42 and 44 which reside in module 28. Module 26 is now an interferometer that generates reference and measurement beams in a well-known manner and may be in the form of a polarized Michelson interferometer. In a variant of the first embodiment subsequently described, module 26 is in the form of a plane mirror interferometer or a high stability plane mirror interferometer such as those described in the Zanoni paper referenced hereinabove, the entire contents of which are incorporated herein by reference with a measurement beam making a second pass to module 28. The description of the measurement beams of the second pass is the same as corresponding portions of the description given for beams 32 and 34 of the first pass.

Mounted off stage on the lower surface of referent plate 30 is an elongated plane mirror 46. Module 26 directs measurement beam 32 at mirror 42 that reflects it downwardly and to the left so that it impinges on mirror 44 and reflects off it for travel in the z-direction at an angle generally normal to the x-y plane of the wafer as beam 36. Beam 36 reflects off mirror 46, travels back to mirror 44, reflects from mirror 44 to mirror 42 and then travels to the interferometer represented by module 26. In module 26, beam 34 is combined in the usual way with a reference beam to generate an optical signal, and subsequently an electrical signal derived from the optical signal, bearing information about the optical path length difference between the reference and measurement beams. While beams 32–38 are shown separated here, it will be appreciated that they are nominally coextensive.

The optical path length information contained in the electrical signal is processed with knowledge of the index of refraction and vacuum wavelength of measurement and reference beams to extract changes in the physical path length between module 26 and plane mirror 46, which comprises changes in the distance between module 26 and module 28 as well as changes in the altitude between module 28 and extended mirror 46. To determine the changes of the altitude, module 26 is provided with another interferometer that measures changes in the x-distance from module 26 to module 28 located on wafer stage 12, and this is subtracted from the corresponding change in physical path length, x+z (the altitude).

For certain end use applications, it may be necessary to compensate for variations in the index of refraction of a medium over the measurement path brought about by environmental changes and turbulence effects induced by rapid slew rates of the stages. To accomplish this, use of the apparatus and methods disclosed in commonly owned U.S. patent application Ser. Nos. 09/252,266, 09/252,440 (U.S. Pat. No. 6,219,146), and Ser. No. 09/232,515 (U.S. Pat. No. 6,124,931) may be made and the disclosures of these copending patent applications are incorporated herein by reference in their entirety.

For certain other end use applications, it may be necessary to compensate for cyclic errors in measured phases of the electrical interference signals containing information about the altitude. The effects of cyclic errors can be reduced and/or measured and compensated in part or whole, as required by the end use application, with the incorporation of methods and apparatus such as described in G. Wilkening and W. Hou, U.S. Pat. No. 5,331,400 entitled "Heterodyne Interferometer Arrangement" issued Jul. 19, 1994; in copending, commonly owned U.S. patent application with Ser. No. 09/168,200 by S. R. Paterson, V. G. Bagdami, and C. A. Zanoni entitled "Interferometry System Having Reduced Cyclic Errors" filed Oct. 6, 1998 (U.S. Pat. No. 6,181,420); in copending, commonly owned U.S. patent application with Ser. No. 09/268,619 by H. A. Hill entitled "Systems and Methods For Characterizing Cyclic Errors In Distance Measuring and Dispersion Interferometry" filed Mar. 15, 1999 (U.S. Pat. No. 6,137,574); and in copending, commonly owned U.S. patent application with Ser. No. 09/557,338 by H. A. Hill entitled "Systems and Methods For Quantifying Nonlinearities In Interferometry Systems" filed Apr. 24, 2000. The contents of the three copending applications are incorporated herein by reference.

In addition to being able to measure altitude, the first embodiment comprising interferometer 26, subsystem 40, and elongated mirror 46 by virtue of its use of the Penta prism and plane mirror combination is insensitive to stage tilt about the y-axis. It is, however, sensitive to roll about the x-axis and yaw about the z-axis, and this sensitivity manifests itself as angular and shear (lateral offset) departures of the measurement and reference beams at the detector of the interferometer module 26. For the single pass system of the first embodiment where both the reference and measurement beams make one round trip excursion through the interferometer, the magnitude of the angular departure in the x-y plane is given by $2(\Delta\theta_x+\Delta\theta_z)$, where $\Delta\theta_x$ and $\Delta\theta_z$ are the angular stage roll about the x-axis and the angular stage yaw about the z-axis, and the shear is given by $2(\Delta\theta_x L+\Delta\theta_z L)$, where L is a characteristic length that differs among embodiments. These magnitudes, while not acceptable for work requiring the larger values of $\Delta\theta_x$ and $\Delta\theta_z$, nevertheless will be acceptable for many applications of lesser values of $\Delta\theta_x$ and $\Delta\theta_z$. The determination of acceptable values of $\Delta\theta_x$ and $\Delta\theta_z$ is based on consideration of the fringe contrast at the detector of a mixed output beam.

The variant of the first embodiment comprises module 28, elongated mirror 46, and module 26 in the form of a double pass interferometer such as a plane mirror interferometer or a high stability plane mirror interferometer such as those described in the Zanoni paper referenced hereinabove. The description of the measurement beams of the second pass is the same as corresponding portions of the description given for beams 32 and 34 of the first pass.

In addition to being able to measure altitude, the variant of the first embodiment by virtue of its use of the double pass of the measurement beam to extended mirror 46 is insensitive to stage roll about the x-axis, tilt about the y-axis, and yaw about the z-axis with respect to the relative directions of propagation of the measurement and reference beam components of the output beam the interferometer system. It is, however, sensitive to stage roll about the x-axis and yaw about the z-axis and this sensitivity manifests itself as shear (lateral offset) departures of the measurement and reference beams at the detector of the interferometer module 26. For the double pass system of the variant of the first embodiment where both the reference and measurement beams make two round trip excursions through the interferometer, the magnitude of the angular departure in the x-y plane is given by $4(\Delta\theta_x+\Delta\theta_z)$, where $\Delta\theta_x$ and $\Delta\theta_z$ are the angular stage roll about the x-axis and the angular stage yaw about the z-axis, and the shear is given by $4(\Delta\theta_x L+\Delta\theta_z L)$, where L is a characteristic length that differs among embodiments. These magnitudes, while not acceptable for work requiring the larger values of $\Delta\theta_x$ and $\Delta\theta_z$, nevertheless will be acceptable for many applications of lesser values of $\Delta\theta_x$ and $\Delta\theta_z$. The determination of acceptable values of $\Delta\theta_x$ and $\Delta\theta_z$ is based on consideration of the degree of overlap of the measurement and reference beams at the detector of a mixed output beam.

Figure 2B:
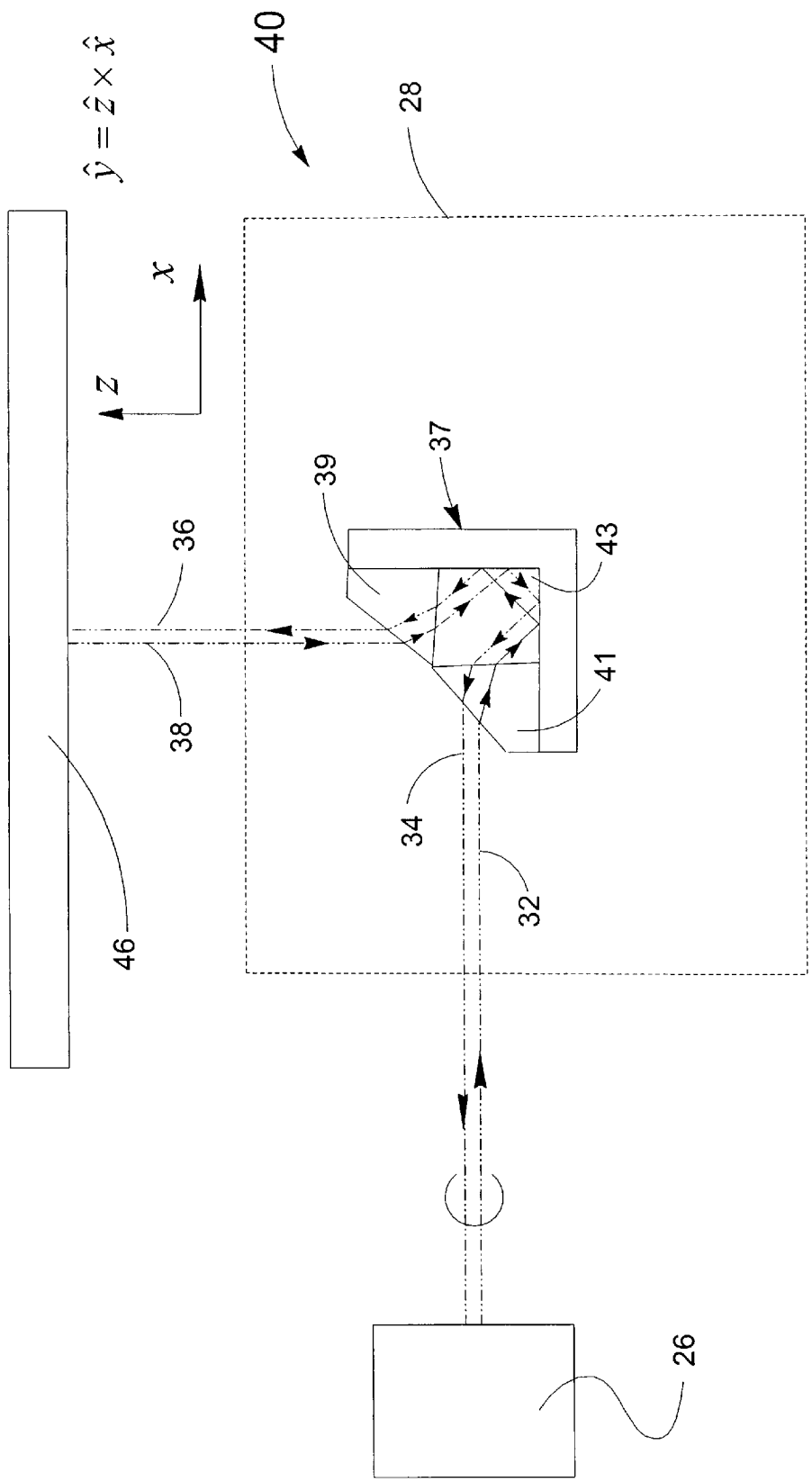

Reference is now made to FIG. 2b which shows an alternative to the Penta prism arrangement of FIG. 2a. Here, Penta prism elements 42 and 44 of FIG. 2a are replaced by optically equivalent prismatic assembly 37 which includes prismatic elements 39, 41 and 43.

Figure 3A:
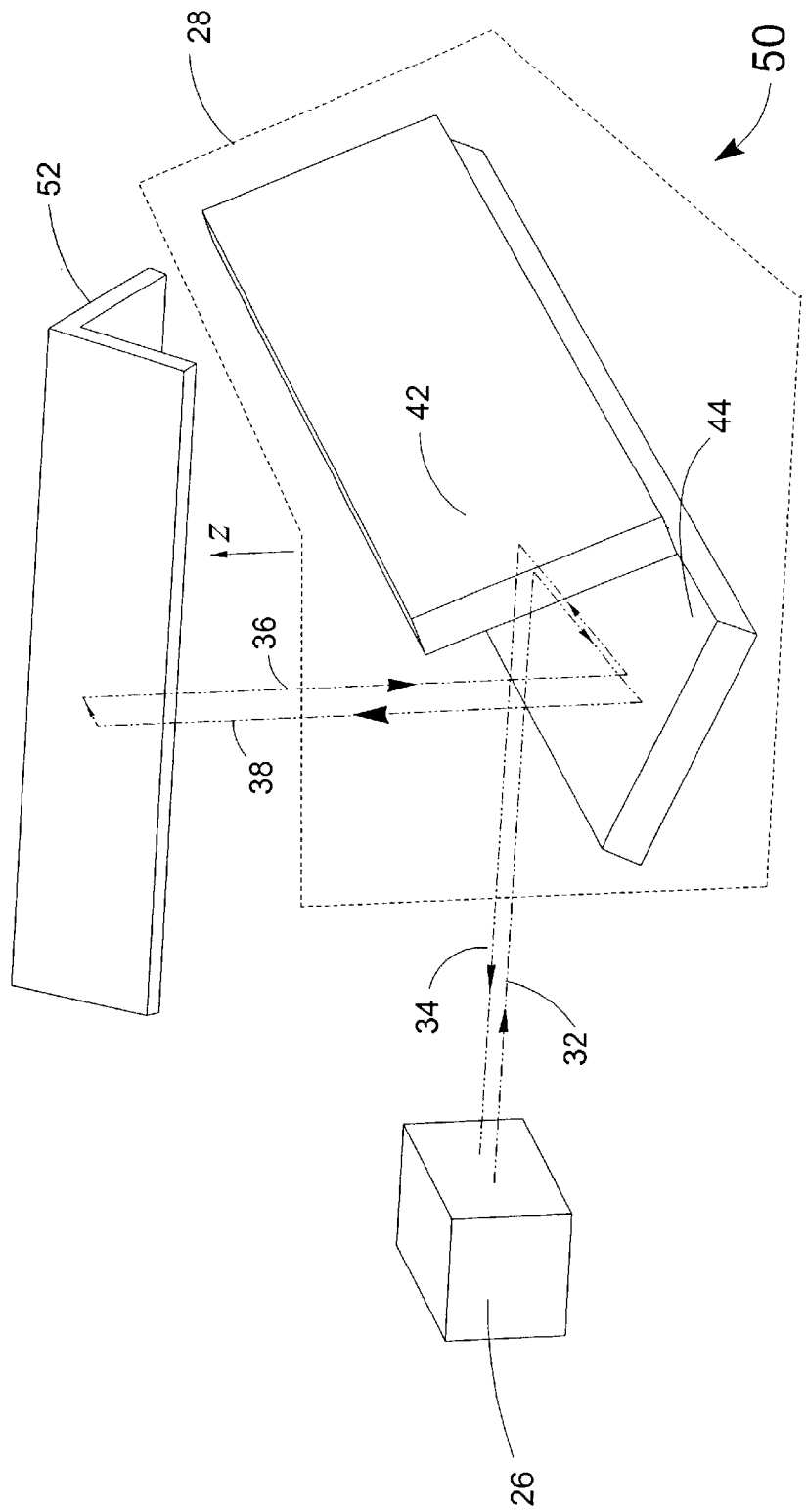
FIG. 3a is diagrammatic perspective view of a second embodiment is diagrammatic perspective view of a second embodiment of the invention employing a stage mounted open elongated Penta prism in conjunction with an off-stage mounted open elongated Porro mirror for measuring the altitude of a datum line associated with the optical projection system of a photolithographic stepper with respect to the wafer plus the distance from an off stage interferometer to the point from which the altitude is measured.

Referring now to FIG. 3a, there is shown in diagrammatic perspective of a second embodiment of the invention employing a stage mounted open extended Penta prism in conjunction with an off-stage mounted open extended Porro mirror for measuring the altitude of a datum line associated with the optical objective projection system 16 of a Photolithographic stepper (system 10) with respect to the wafer plus the distance from an off stage interferometer (26) to the point from which the altitude is measured (module 28). The second embodiment is shown as comprising a subsystem 50 that is in many respects identical to subsystem 40 but differs in a major way that enhances its performance compared with that of the first embodiment comprising subsystem 40. Elements of subsystem so that are substantially the same as those of subsystem 40 retain their same numerical identification in FIG. 3.

Subsystem 50 differs from subsystem 40 by virtue of the use of an extended Porro prism 52 on plate 16 instead of extended plane mirror 46. The use of extended Porro prism 52 introduces a lateral shear in the measurement beam that requires that the interferometer in module 26 be likewise modified so that the reference beam has a like offset.

Because of the use of the Porro prism 52, the magnitude of the angular separation and lateral shear between the reference and measurement beams is now identically zero whether the interferometer is of single or double pass architecture. This means that subsystem 50 is insensitive to changes in pitch, yaw and roll of the wafer stage.

Figure 3B:
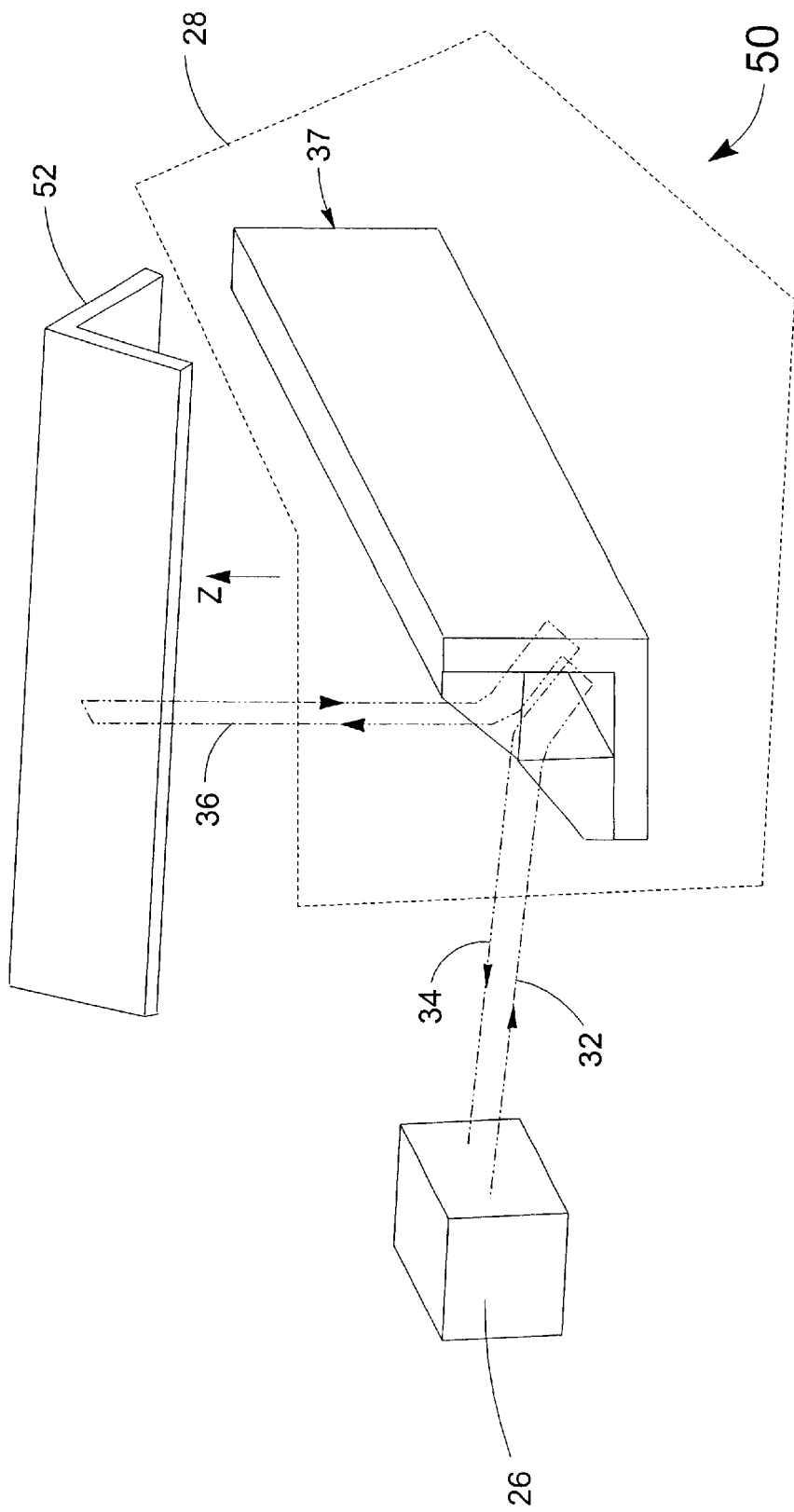

FIG. 3b shows an alternative to FIG. 3a in which the elongated Penta prism elements 42 and 44 are replaced by elongated Penta prism assembly 37.

Figure 4:
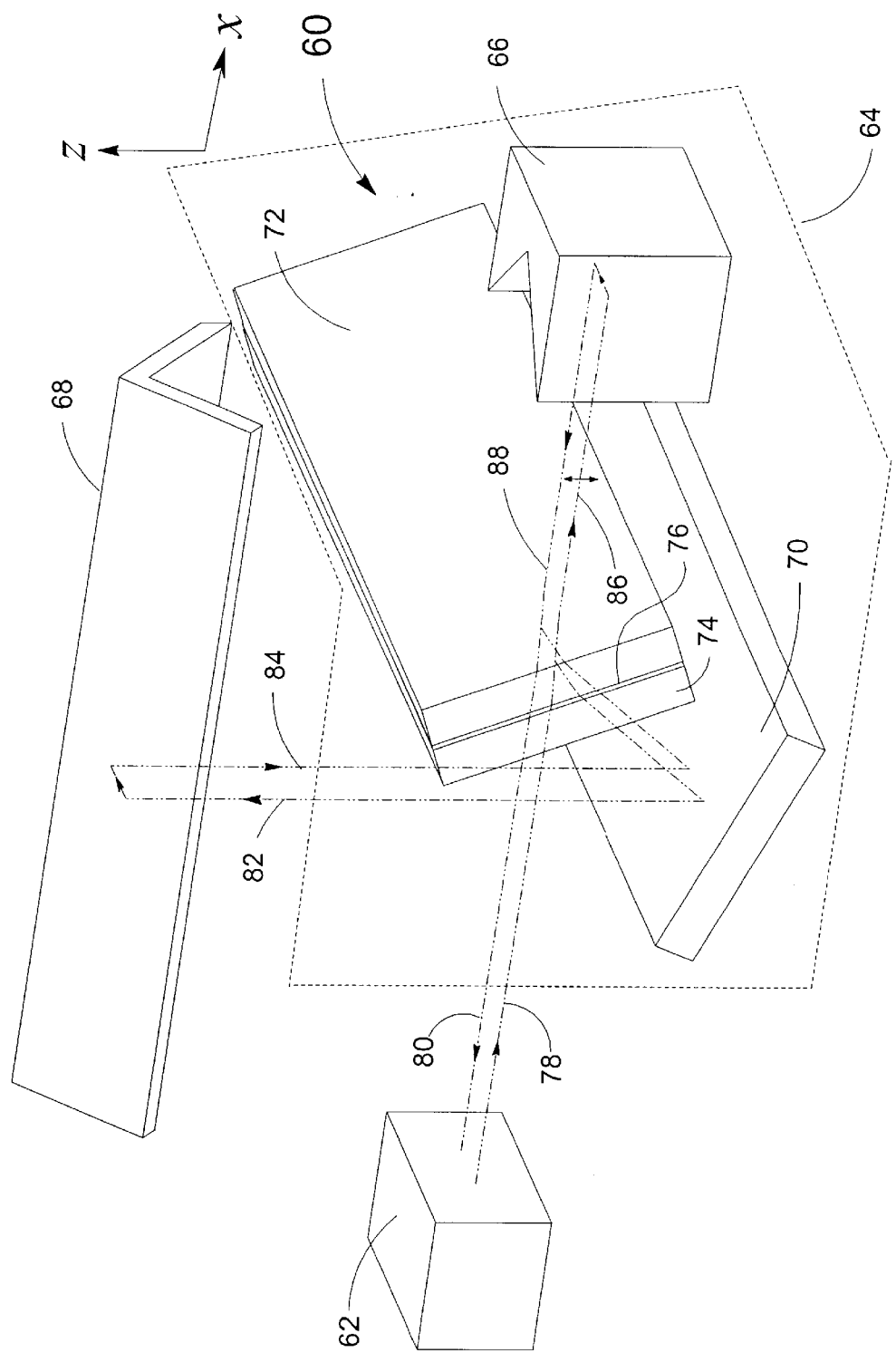
FIG. 4 is diagrammatic perspective view of a third embodiment of the invention employing a stage mounted elongated Penta prism in conjunction with an off-stage mounted retroreflector and elongated Porro mirror for measuring the altitude of a datum line associated with the optical projection system of a photolithographic stepper with respect to the wafer plus an orthogonal linear distance to an off-stage reference.

Reference is now made to FIG. 4 which is diagrammatic perspective view of a third embodiment of the invention. The third embodiment employs on and off-stage mounted components that cooperate with one another to measure the altitude of a datum line associated with the optical projection system of a photolithographic stepper with respect to the wafer plus an orthogonal linear distance to an off-stage reference. The third embodiment is shown as subsystem 60 comprising as its major components: off-stage source and detector module 62; on-stage elongated Penta prism and polarizing beam splitter module 64; off-stage open Porro prism 66; and off-stage elongated Porro prism 68. Prism 68 is fixed to the bottom surface of plate 30, and module 62 and prism 66 are fixed with respect to the system metrology frame (not shown) while module 64 is fixedly mounted with wafer stage 12 and moves with it.

On-stage Penta prism and polarizing beam splitter module 64 comprises a lower plane mirror 70, an upper plane mirror assembly comprising an upper plane mirror 72, lower plane mirror 74, and a polarizing beam splitter layer 76 (PBS) sandwiched between the two.

Off-stage source and detector module 62 is configured in a well-known manner to provide an input beam 78. Input beam 78 comprises two orthogonally polarized components having a difference in frequencies $f_1$. Source 10 of input beam 12 such as a laser can be any of a variety of frequency modulation apparatus and/or lasers. For example, the laser can be a gas laser, e.g., a HeNe laser, stabilized in any of a variety of conventional techniques known to those skilled in the art, see for example, T. Baer et al., "Frequency Stabilization of a 0.633 μm He—Ne-longitudinal Zeeman Laser," *Applied Optics*, 19, 3173–3177 (1980); Burgwald et al., U.S. Pat. No. 3,889,207, issued Jun. 10, 1975; and Sandstrom et al., U.S. Pat. No. 3,662,279, issued May 9, 1972. Alternatively, the laser can be a diode laser frequency stabilized in one of a variety of conventional techniques known to those skilled in the art, see for example, T. Okoshi and K. Kikuchi, "Frequency Stabilization of Semiconductor Lasers for Heterodyne-type Optical Communication Systems," *Electronic Letters*, 16, 179–181 (1980) and S. Yamaqguchi and M. Suzuki, "Simultaneous Stabilization of the Frequency and Power of an AlGaAs Semiconductor Laser by Use of the Optogalvanic Effect of Krypton," *IEEE J. Quantum Electronics*, QE-19, 1514–1519 (1983).

Two optical frequencies may be produced by one of the following techniques: (1) use of a Zeeman split laser, see for example, Bagley et al., U.S. Pat. No. 3,458,259, issued Jul. 29, 1969; G. Bouwhuis, "Interferometrie Mit Gaslasers," Ned. T. Natuurk, 34, 225–232 (August 1968); Bagley et al., U.S. Pat. No. 3,656,853, issued Apr. 18, 1972; and H. Matsumoto, "Recent interferometric measurements using stabilized lasers," *Precision Engineering*, 6(2), 87–94 (1984); (2) use of a pair of acousto-optical Bragg cells, see for example, Y. Ohtsuka and K. Itoh, "Two-frequency Laser Interferometer for Small Displacement Measurements in a Low Frequency Range," *Applied Optics*, 18(2), 219–224 (1979); N. Massie et al., "Measuring Laser Flow Fields With a 64-Channel Heterodyne Interferometer," *Applied Optics*, 22(14), 2141–2151 (1983); Y. Ohtsuka and M. Tsubokawa, "Dynamic Two-frequency Interferometry for Small Displacement Measurements," *Optics and Laser Technology*, 16, 25–29 (1984); H. Matsumoto, ibid.; P. Dirksen, et al., U.S. Pat. No. 5,485,272, issued Jan. 16, 1996; N. A. Riza and M. M. K. Howlader, "Acousto-optic system for the generation and control of tunable low-frequency signals," *Opt. Eng.*, 35(4), 920–925 (1996); (3) use of a single acousto-optic Bragg cell, see for example, G. E. Sommargren, commonly owned U.S. Pat. No. 4,684,828, issued Aug. 4, 1987; G. E. Sommargren, commonly owned U.S. Pat. No. 4,687,958, issued Aug. 18, 1987; P. Dirksen, et al., ibid.; (4) use of two longitudinal modes of a randomly polarized HeNe laser, see for example, J. B. Ferguson and R. H. Morris, "Single Mode Collapse in 6328 Å HeNe Lasers," *Applied Optics*, 17(18), 2924–2929 (1978); (5) use of birefringent elements or the like internal to the laser, see for example, V. Evtuhov and A. E. Siegman, "A "Twisted-Mode" Technique for Obtaining Axially Uniform Energy Density in a Laser Cavity," *Applied Optics*, 4(1), 142–143 (1965); or the use of the systems described in U.S. patent application with Ser. No. 09/061,928 filed Apr. 17, 1998, now U.S. Pat. No. 6,236,507 issued on May 22, 2001, entitled "Apparatus to Transform Two Non-Parallel Propagating Optical Beam Components into Two Orthogonally Polarized Beam Components" by H. A. Hill, the contents of which are incorporated herein by reference.

The specific device used for the source of beam 78 will determine the diameter and divergence of beam 78. For some sources, e.g., a diode laser, it will likely be necessary to use conventional beam shaping optics, e.g., a conventional microscope objective, to provide beam 78 with a suitable diameter and divergence for elements that follow. When the source is a HeNe laser, for example, beam-shaping optics may not be required.

Input beam 78 strikes PBS layer 76 and one of its polarized components is reflected from it to mirror 70, beginning travel along a measurement path as a measurement beam. After striking mirror 70, this polarized component proceeds to Porro prism 68 as measurement beam component 82. Beam component 82 enters Porro prism 68 after which it is returned to mirror 70 as measurement beam component 84. Beam component 84 is reflected from PBS layer 76 and proceeds as a measurement component of return beam 80 to the detector (not shown) located in module 62.

The other polarized component of beam 78 is transmitted through PBS layer 76 where it proceeds to Porro prism 66 as reference beam component 86, Porro prism 66 being a reference in this case. Reference beam component 86 is returned by Porro prisms 66 as reference beam component 88 which is transmitted through PBS layer 76 to be combined as a reference beam component of return beam 80. The reference and measurement beam components of beam 80 are mixed and analyzed in a well-known manner to extract phase information related to the z+x dimension of which the x-component is determined via another interferometer (not shown) or through the use of additional beams generated by module 62, but sent to a planar reference mirror located on wafer stage 12 in a well-known manner.

The third embodiment is insensitive to stage rotation about the x, y, and z-axes, has no lateral shear in y, and has lateral shear in x and z. The magnitude of the lateral shear in x is given by $\Delta\theta_x a_y$, where $a_y$ is the spacing between input and output beams 78 and 80, respectively. The magnitude of the lateral shear in z is given by $\Delta\theta_z a_y$.

Figure 5:
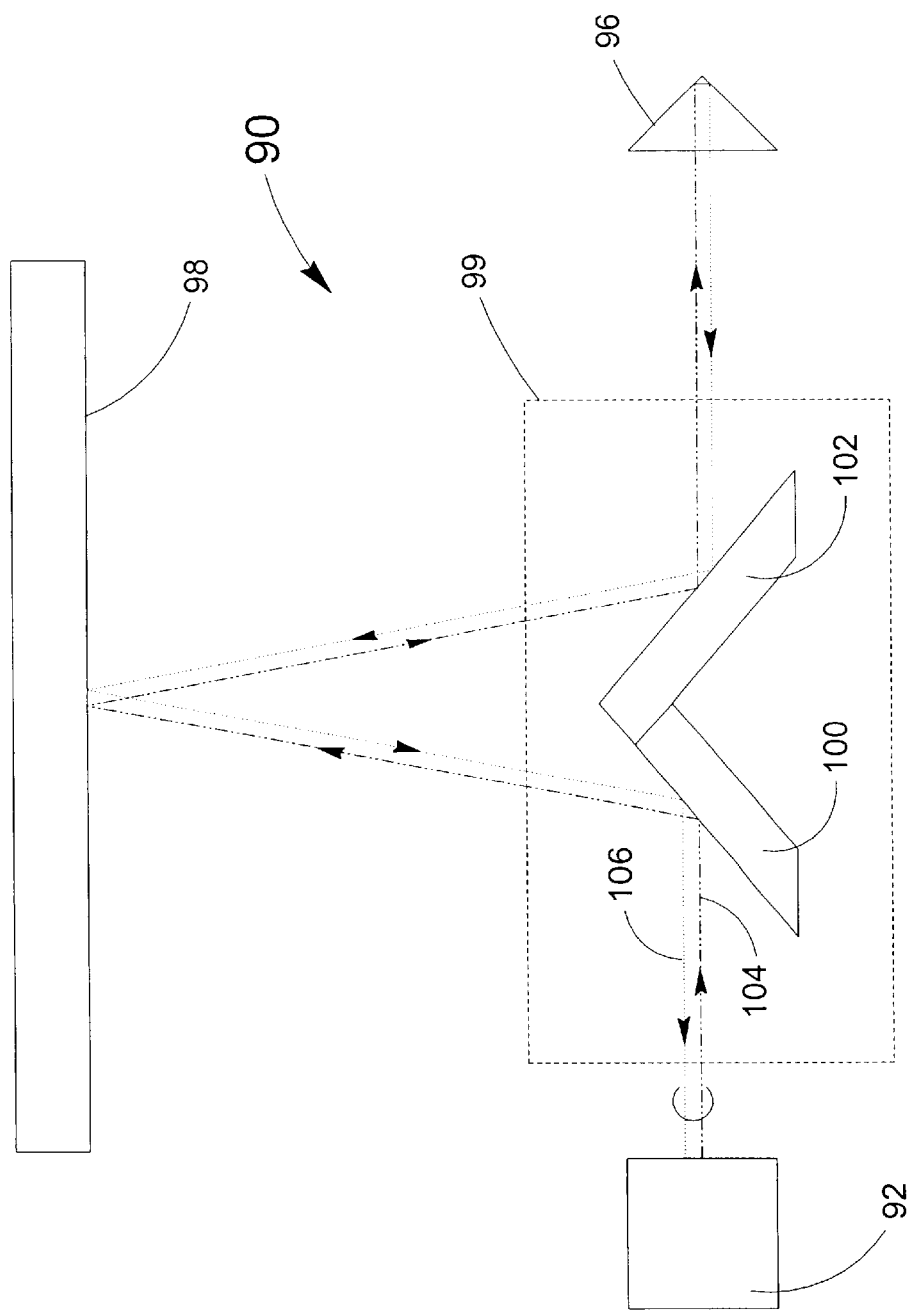
FIG. 5 is diagrammatic elevational view of a fourth embodiment of the invention employing a stage mounted elongated prism in conjunction with an off-stage mounted retroreflector and planar elongated mirror for measuring the altitude of a datum line associated with the optical projection system of a photolithographic stepper with respect to the wafer.

Reference is now made to FIG. 5 which is an elevational view (x-z plane of FIG. 1) of a fourth embodiment of the invention. The fourth embodiment employs a stage mounted elongated prism in conjunction with an off-stage mounted retroreflector and planar mirror for measuring changes in the altitude of a datum line associated with the optical projection system of a photolithographic stepper with respect to the wafer. The fourth embodiment, designated as subsystem 90, comprises as its major components: an off-stage interferometer 92, an elongated (z-direction) on-stage prism assembly 94 fixedly mounted to wafer stage 12 for movement with it, and off-stage retroreflector 96 (e.g., corner cube), and an elongated plane mirror 98 fixedly mounted to the underside of plate 30. Interferometer 92 and retroreflector 96 are fixedly attached to the system metrology frame (not shown).

Interferometer 92 may be, for example, a differential plane mirror type (DPMI) or a high stability differential plane mirror type (HSDPMI) and operates to produce a measurement beam 104 that travels among the various other components of subsystem 90 to return as measurement beam 106. Measurement beam 106 is combined with a reference beam within interferometer 92 in a well-known way to generate phase information related to the optical path length difference between them. This information is electronically analyzed to extract changes in the altitude directly. As such this embodiment has as an advantage the property that the altitude information is completely decoupled from any x-direction measurements. This property is important because the altitude, having a relatively smaller optical path length than any measurement of x and y, is substantially less sensitive to variations in the index of refraction caused by environmental and turbulence effects. Consequently, compensation for these effects may not be required in the measurement of changes in altitude thereby making the system much less complex and hence less costly. In addition, it should be noted that this embodiment advantageously requires no phase shift elements.

The architecture of the fourth embodiment is also insensitive to angular changes about the x, y, and z-axes but does have lateral shear in x, y, and z. The magnitude of the lateral shear in x is given by $4\Delta\theta_x L_R$ where $L_R$ is the prism retroreflector spacing. The magnitude of the lateral shear in y is given by $8\Delta\theta_y L_R$ and in z by $4\Delta\theta_z z$. There is additional lateral shear in z caused by stage translation, and this is given by $2\Delta z$; all of the foregoing lateral shear components being for a single pass system.

Figure 6:
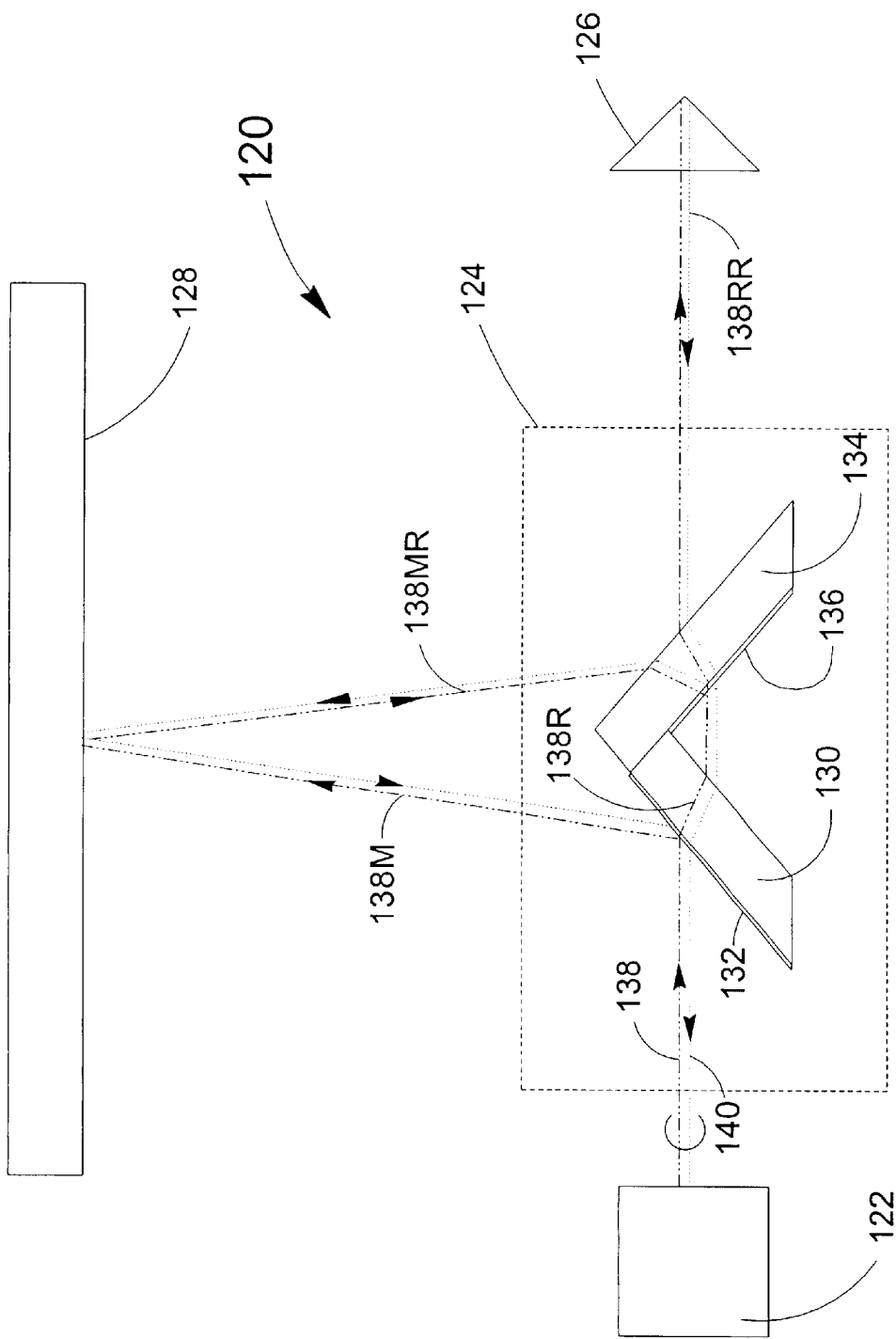
FIG. 6 is diagrammatic elevational view of a fifth embodiment of the invention employing a stage mounted interferometer comprising an elongated prism, having polarization beam splitting layers, in conjunction with an off-stage mounted retroreflector and planar elongated mirror for measuring the altitude of a datum line associated with the optical projection system of a photolithographic stepper with respect to the wafer.

FIG. 6 is diagrammatic elevational view (x-z plane) of a fifth embodiment of the invention employing a stage mounted elongated prism, having polarization beam splitting layers, that operates in conjunction with an off-stage mounted retroreflector and elongated planar mirror for measuring changes in altitude with respect to the wafer of a datum line associated with the optical projection system of a photolithographic stepper. The fifth embodiment, designated as subsystem 120, comprises an off-stage source and detector module 122, an on-stage elongated Porro prism beam splitter assembly 124, an off-stage retroreflector 126, and a flat, off-stage elongated mirror 128 fixedly mounted to the underside of plate 30.

Module 122 and retroreflector 126 are fixedly mounted with the system metrology frame, and retroreflector 126 preferably is a polarization preserving optical system but may be a corner cube.

Assembly 124 comprises a first optically flat plate element 130 bearing a polarization beamsplitting layer 132 (first PBS) on its outermost surface and a second optically flat plate element 134 bearing a polarization beamsplitting layer 136 (second PBS) on its innermost surface. First and second PBSs are preferably structured to reflect measurement beams and transmit reference beams.

Source and detector module 122 is configured to provide an input beam 138 having orthogonally polarized beam components that differ in frequency as explained previously hereinabove. One of beam 138's polarization components serves as the interferometer measurement beam and is generally designated as 138M while the other serves as the reference beam and is generally designated as 138R.

When beam 138 encounters PBS 132, it is split into its polarization encoded components with beam 138M proceeding to flat elongated mirror 128 from which it is reflected to proceed toward plate element 134. There, it is refracted and proceeds to PBS 136, reflects off PBS 136, is refracted by the outermost surface of element 134, and proceeds to retroreflector 126. From retroreflector 126, it is sent back to element 134, is again refracted by the outermost surface, proceeds to PBS 136, is reflected off it and is then refracted by outermost surface again. Thereafter, it proceeds to flat elongated mirror 128 as a return beam 138MR. Flat stick mirror 128 reflects beam 138MR so that it proceeds back to PBS 132 from which it is reflected to become the measurement beam component of beam 140.

Reference beam 138R first passes through PBS 132, being refracted in the process, and then is refracted once again as it exits the underside of element 130. It then proceeds to PBS 136, passing through it while being refracted, and then exits element 134 at its uppermost surface to proceed to retroreflector 126. Beam 138R is reflected from retroreflector 126 as beam 138RR which proceeds back through prism assembly 124 on a path which is the reverse of its entering path. Beam 138RR is reunited with beam 138MR at PBS 132 and proceeds as a reference beam component of beam 140. Beams 138MR and 138RR are recombined and analyzed in a well-known way to extract phase information from which changes in altitude are determined using electronic signal processing procedures.

This embodiment has several advantageous properties comprising: (1) no phase shifting elements are needed; (2) there is no Doppler shift in x since the measurement and reference beams are coextensive in x, and (3) no compensation for variations in index of refraction in x are needed also because the measurement and reference beams are coextensive in x, although compensation may be required in z to meet particular requirements on precision, but otherwise not, since changes in altitude are directly measured.

The fifth embodiment in insensitive to stage rotations about the x, y, and z axes but has lateral shear contributions given as follows. In x, the lateral shear is $4\Delta\theta_x L_R$; in y it is given by $8\Delta\theta_y L_R$; and in z it has two terms given by $4\Delta\theta_z z$ and $4\Delta z$.

Figure 7:
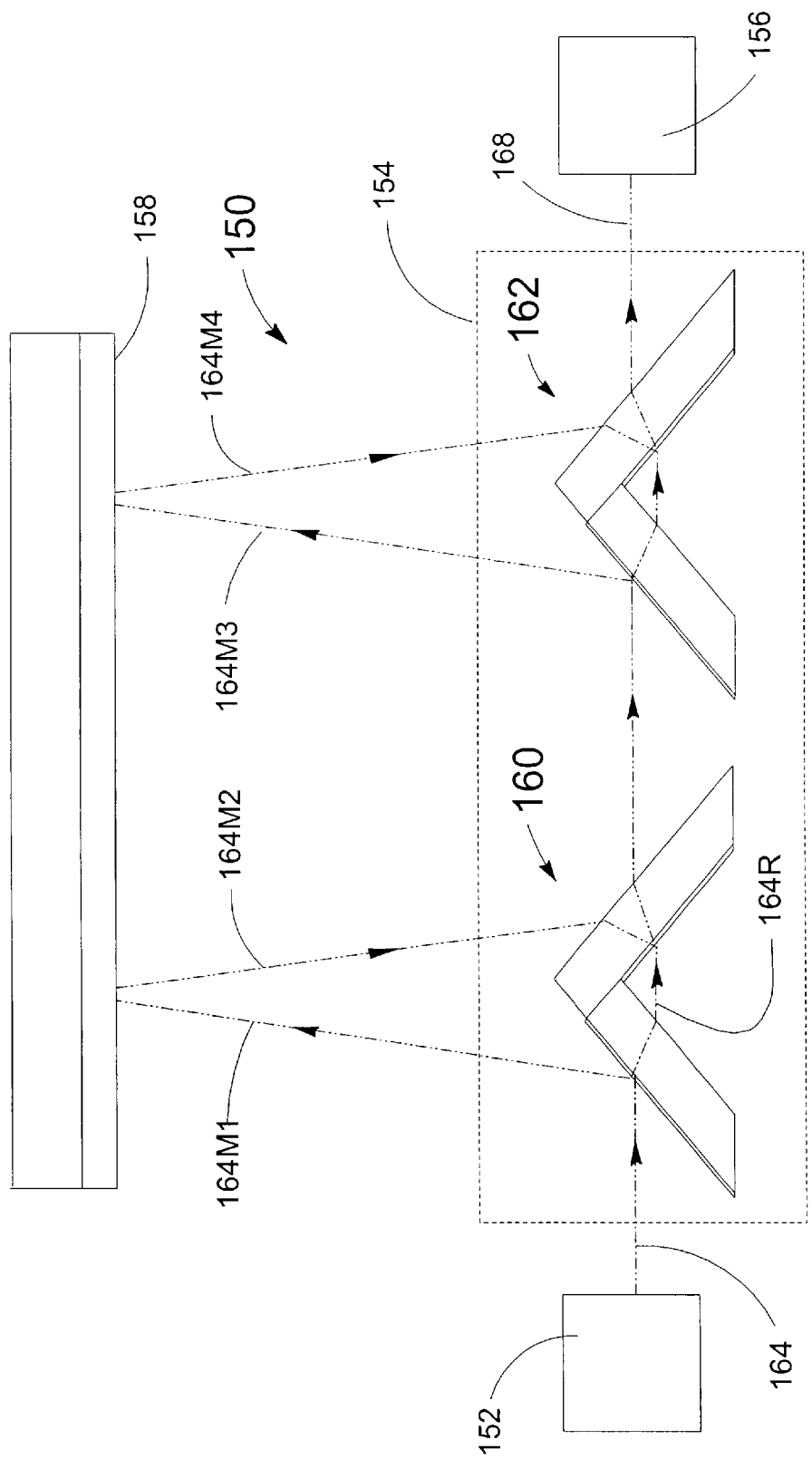
FIG. 7 is diagrammatic elevational view of a sixth embodiment of the invention employing stage mounted interferometer comprising a pair of elongated prisms, each having polarization beam splitting layers, in conjunction with an off-stage mounted retroreflector, source, and detector for measuring twice the altitude of a datum line associated with the optical projection system of a photolithographic stepper with respect to the wafer.

Reference is now made to FIG. 7 which is an elevational view (x-z plane) of a sixth embodiment of the invention employing a pair of stage mounted elongated prisms, each carrying PBS layers, that operate in conjunction with an off-stage mounted source, detector, and retroreflector for measuring twice the changes in altitude of a datum line associated with the optical projection system of a photolithographic stepper with respect to the wafer.

The sixth embodiment, designated generally as subsystem 150, comprises an off-stage mounted source 152, an elongated prism polarizing beamsplitter assembly 154 that includes two prism polarizing beamsplitter components 160 and 162, an offstage mounted detector 156, and an off-stage Porro elongated mirror 158 that is fixedly mounted to the underside of plate 30. Source 152 and detector 156 are fixedly mounted in the system's metrology frame for dimensional stability.

Source 152 is structured to provide an input beam 164 having orthogonally polarized beam components of different frequency as previously explained. Input beam 164 is split into these components at the first PBS layer of component 160 as explained before in connection with the description of its analog in FIG. 6. One of the components proceeds to mirror 158 as measurement beam 164M1 while the other proceeds directly to detector 156 as a reference component of output beam 168.

Beam 164M1 is laterally displaced in the y-direction by Porro mirror 158 and is returned toward component 160 on wafer stage 12 as beam 164M2. Thereafter, it is directed to component 162 which redirects it to Porro mirror 158 as beam 164M3, which is in the same plane as beam 164M2. Beam 164M3 is laterally offset by Porro mirror 158 while being returned to component 162 as beam 164M4, now in the same plane as beam 164M1 and 164R. Measurement beam 164M4 is reunited with beam 164R at the last PBS of component 162 where it travels to detector 156 as a measurement component of beam 168.

Beams 164R and 164M4 are mixed to generate an electrical signal containing phase information from which the twice the change in altitude is extracted directly using electronic signal processing procedures. Here, again this embodiment has the same advantageous properties as those of the fifth embodiment of FIG. 6. In addition, it will be recognized that the intervening space between components 160 and 162 may be covered to reduce turbulence effects that could operate on the measurement and reference beam segments traveling in this space.

The sixth embodiment is insensitive to angular rotations about the x, y, and z-axes and has no lateral shear, as well.

Figure 8A:
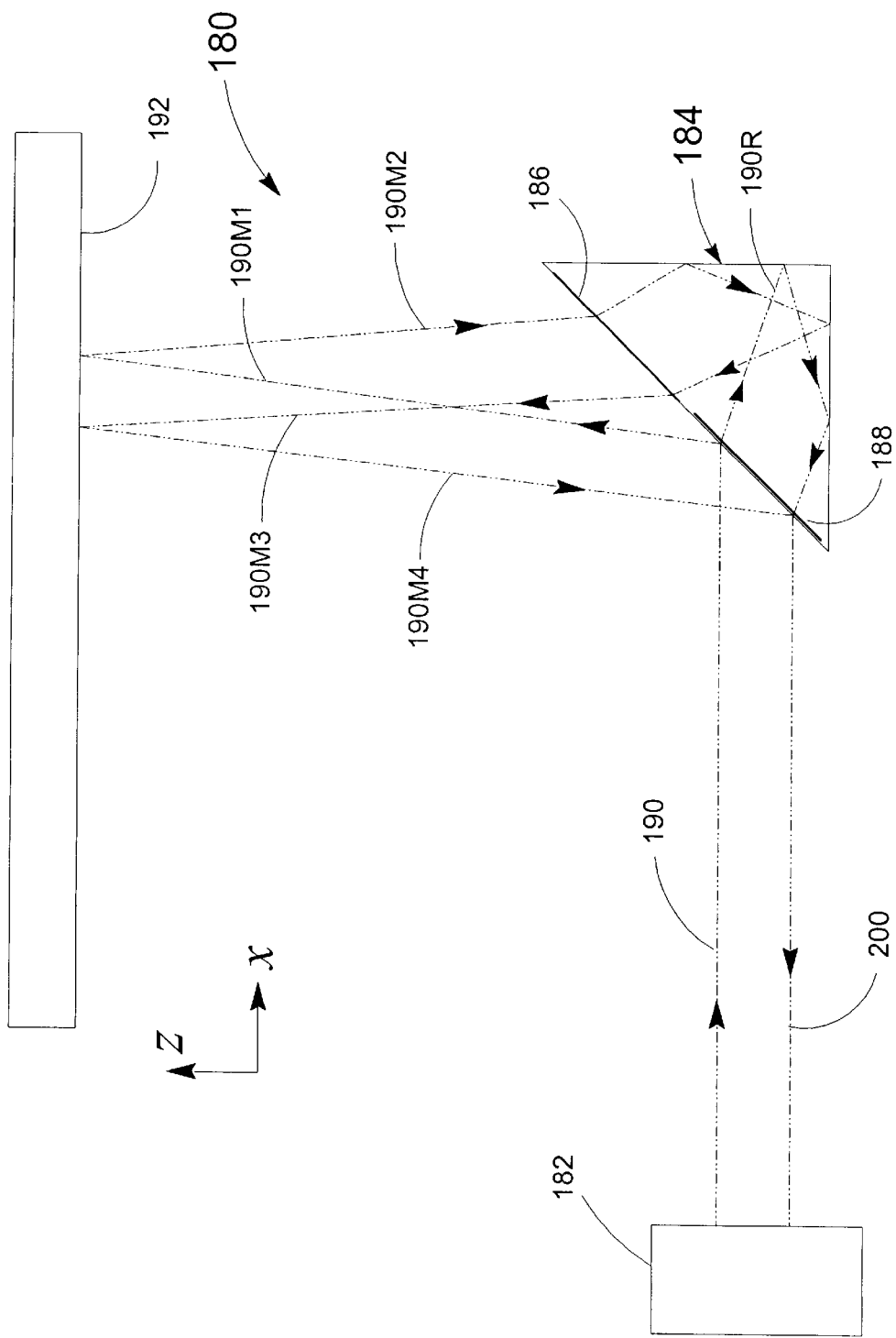
FIG. 8a is diagrammatic elevational view of a seventh embodiment of the invention employing a stage mounted interferometer comprising an elongated prism, having a front surface that is partially a polarization beam splitting layer and partially anti-reflection coated, that operates in conjunction with an off-stage mounted planar elongated mirror for measuring the altitude of a datum line associated with the optical projection system of a photolithographic stepper with respect to the wafer.

Reference in now made to FIG. 8a which is diagrammatic elevational view (x-z plane) of a seventh embodiment of the invention employing an elongated stage mounted prism, having a front surface that is partially a polarization beam splitting layer and partially anti-reflection coated, and operates in conjunction with an off-stage mounted elongated planar mirror and source and detector module for directly measuring changes in the altitude of a datum line associated with the optical projection system of a photolithographic stepper with respect to the wafer.

The seventh embodiment, designated as subsystem 180, comprises an offstage mounted source and detector module 182, an on-stage mounted elongated right prism 186, and an off-stage elongated planar mirror 192 fixedly mounted to the underside of plate 30.

Prism 186, preferably of fused silica, has a polarization beamsplitting layer 188 (PBS) over half of its hypotenuse surface with the remainder being provided with an antireflection (AR) coating 186.

Module 182 is structured to provide an input beam 190 having orthogonally polarized components of different frequency as previously described with one component serving as the reference beam and the other the measurement beam of the subsystem 180. Again, the PBS 188 is structured to reflect measurement beam components and transmit reference beam components.

Upon striking PBS layer 188, beam 190 is divided into reference beam 190R and measurement beam component 190M1. Beam 190R is refracted at PBS 188, travels to the rear surface of prism 184, reflects off it, and then off the bottom surface of prism 184, after which it is again refracted at PBS 188 to become a reference beam component of output beam 200.

Beam 190M1 proceeds to mirror 192 and is redirected thereby to prism 184 as beam 190M2. Beam 190M2 is refracted upon entering prism 184, is internally reflected twice, and is refracted again as it emerges from prism 184 as beam 190M3. Beam 190M3 reflects from mirror 192 as beam 190M4, which is reflected from PBS 188 to form the measurement component of output beam 200, having been reunited with reference beam 190R at PBS 188.

The components of beam 200 are mixed and electronically analyzed to directly determine changes in the altitude independent of any information about the x position or displacement.

The seventh embodiment is insensitive to angular rotations about the x and y, but in z it is given by $2\Delta\theta_z$. The sensitivity to lateral shear is as follows: in x the lateral shear is given by $4\Delta\theta_x z$; in y it is given by $8\Delta\theta_y z$; and in z it is given by $2\Delta\theta_z L$ and $2\Delta z$. The advantages of the seventh embodiment include its non-inverting property, reduced lateral shear, equal paths for the measurement and reference beams in fused silica, reduced sensitivity to air turbulence and no relative beam shear in z-displacement.

A variant of the seventh embodiment may be made by replacing the off-stage mirror 192 with an elongated Porro prism which would create a lateral offset in between beam pairs 190M1/190M4 and 190M2/190M3. This variant of the seventh embodiment is insensitive to angular rotations about the x, y, and z axes has half the lateral shear of the seventh embodiment in x and the same in y and z.

Figure 8B:
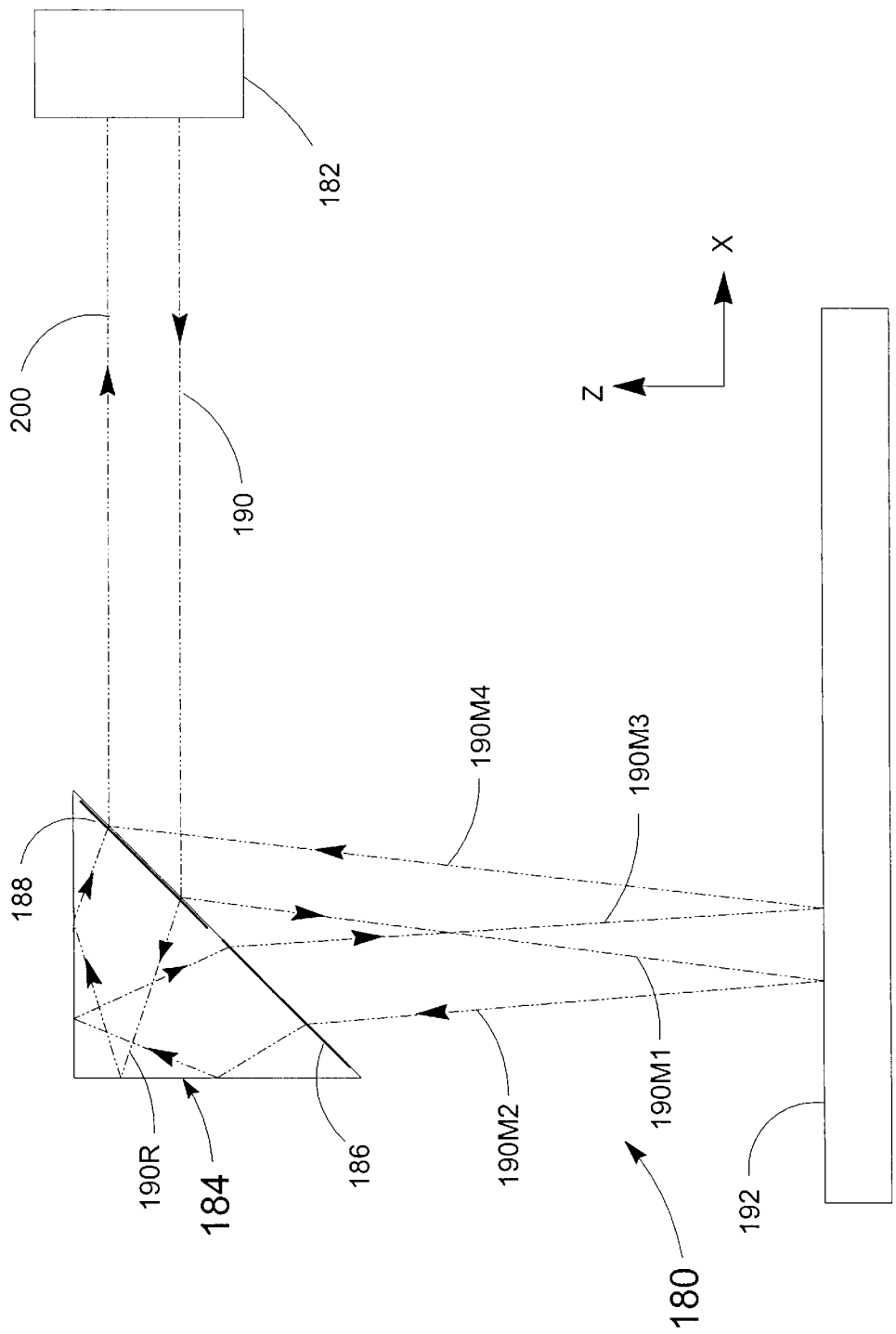
FIG. 8b is diagrammatic elevational view of a downward looking variant of the embodiment of FIG. 8a, FIG. 8c is a diagrammatic elevational view of a variant of the embodiment of FIG. 8b.

FIG. 8b shows an inverted version of subsystem 180 in which its bar mirror 192 is attached to the wafer stage 12 instead of plate 30 while elements 182 and 184 are now off-stage.

Figure 8C:
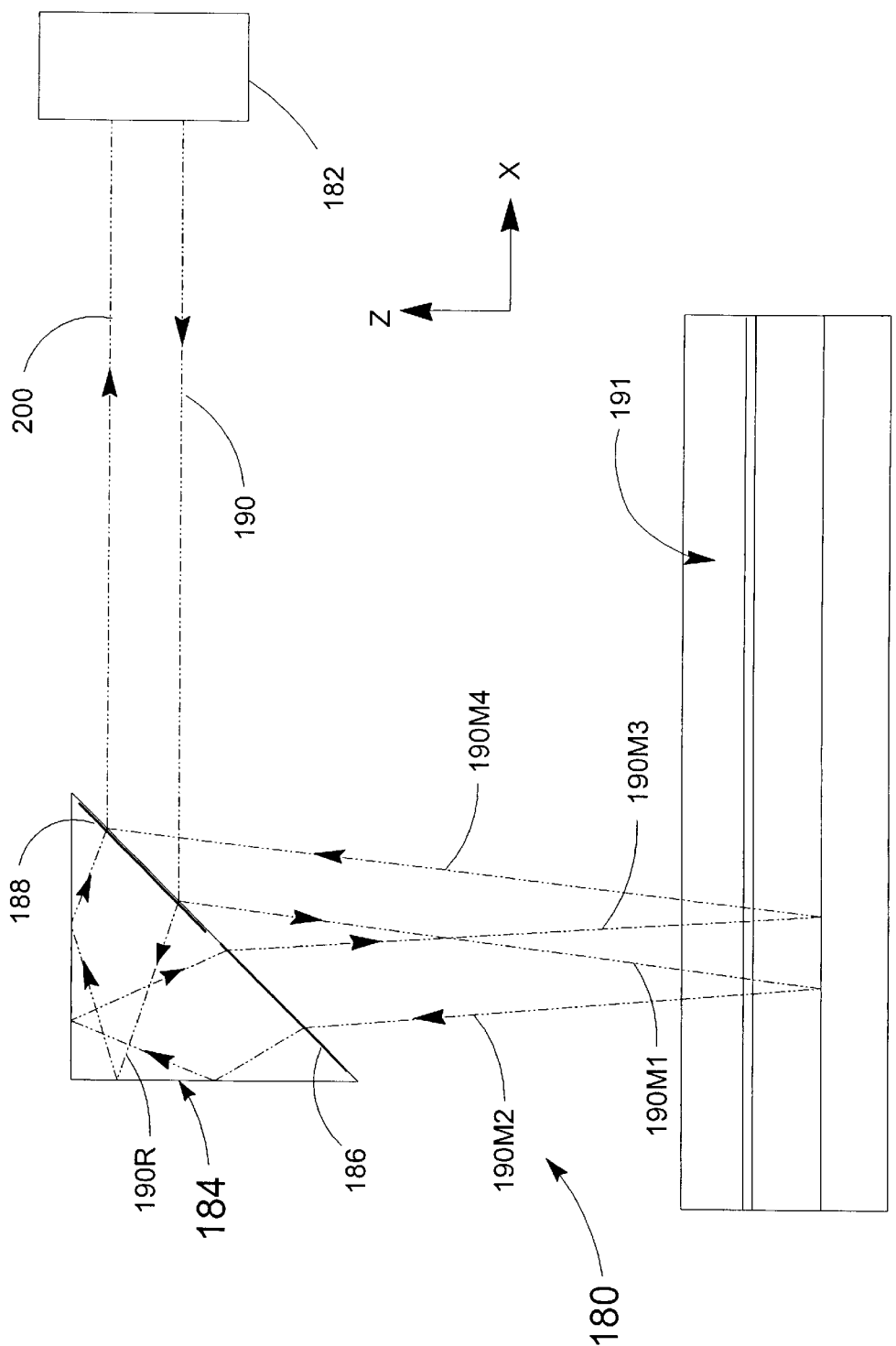
FIG. 8d is an enlarged diagrammatic elevational view of a component of the embodiment of FIG. 8c.
FIG. 8e is an enlarged diagrammatic elevational view of an alternative to the component of FIG. 8d.
Figure 8D:
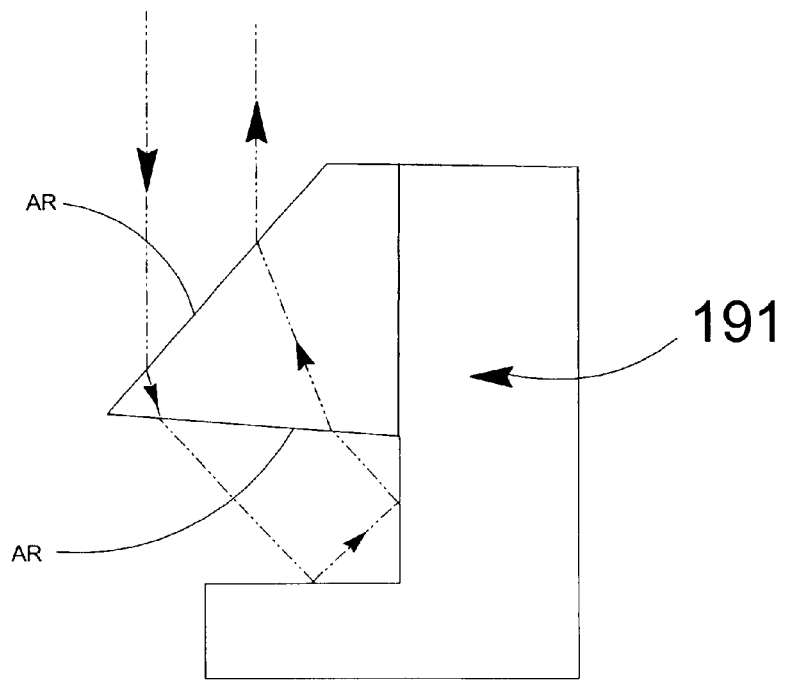

FIG. 8c shows a variant of subsystem 180 of FIG. 8b in which bar mirror 192 is replaced by Porro prism 191 that is shown in cross section in FIG. 8d.

Figure 8E:
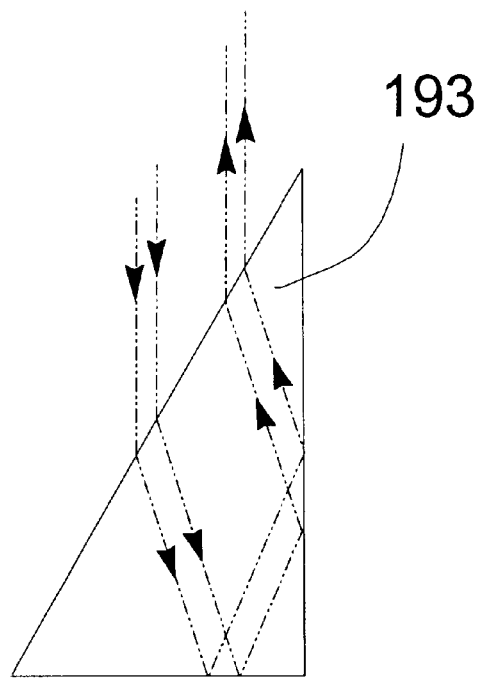

FIG. 8e shows an alternative prismatic element 193 that can be used in place of Porro prism 191 in FIGS. 8c and 8d.

Figure 9A:
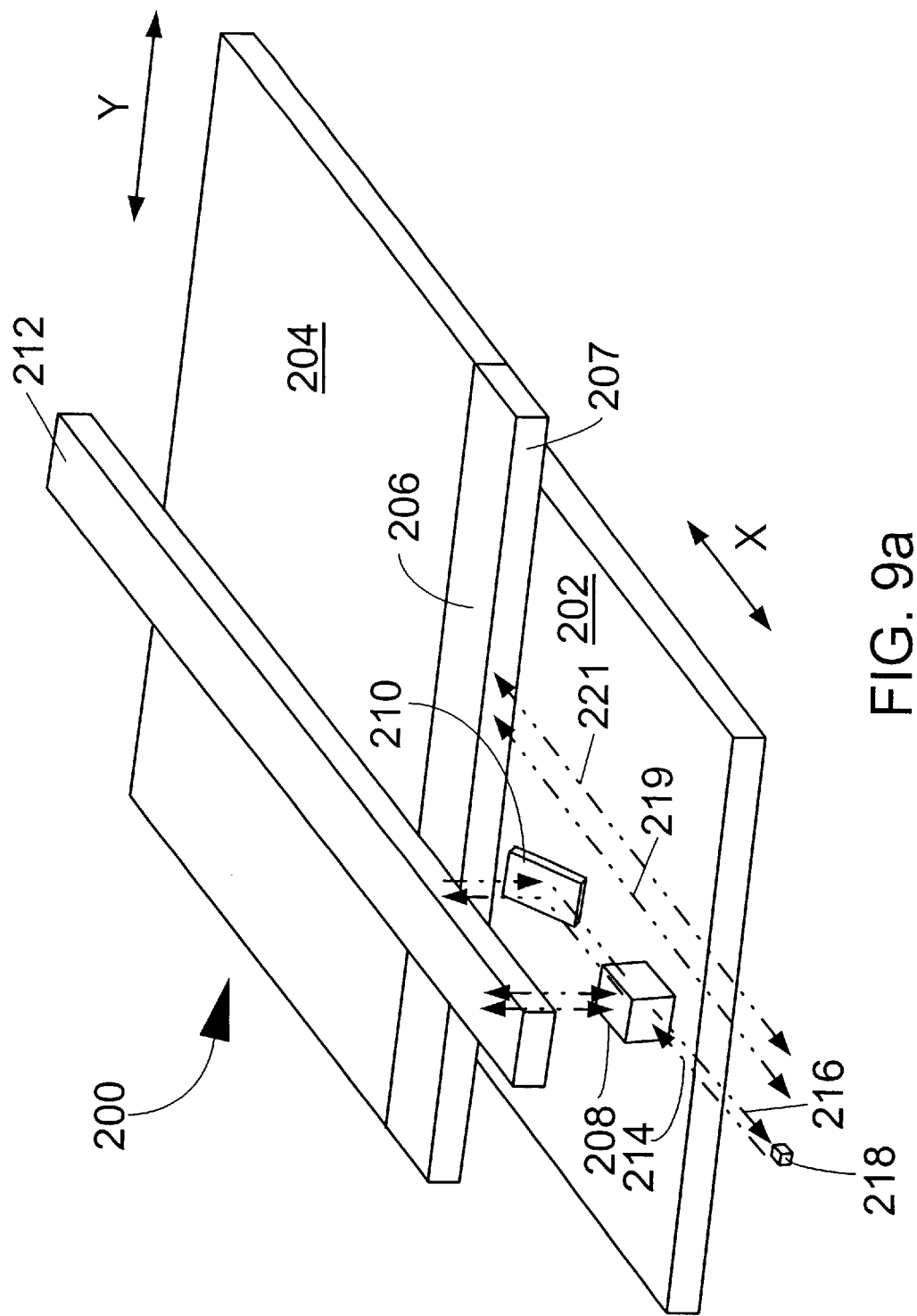
FIG. 9a is a diagrammatic perspective view of an eighth embodiment of the invention that employs a compact interferometer, having relatively small quarter-wave plates, mounted on one translation stage of a photolithographic apparatus to measure changes in altitude between another translation stage and an off-stage mounted elongated mirror.

Reference is now made to FIG. 9a which is a diagrammatic perspective view of an eighth embodiment of the invention designated at system 200. System 200 employs a compact interferometer 208 with relatively small quarter-wave plates mounted on one translation stage, here the x-translation stage designated as 202, of a photolithographic apparatus, to measure changes in altitude between another translation stage, the y-translation stage designated at 204, and an off-stage mounted elongated mirror 212. Y-translation stage 204 is provided with an elongated mirror 206 having an underside that is optically flat to needed tolerances as well as a vertical edge 207. As the x and y translation stages move, system 200 measures changes in altitude between the underside surface of y-translation stage elongated mirror 206 and the bottom surface of elongated mirror 212 along a datum line.

Figure 9B:
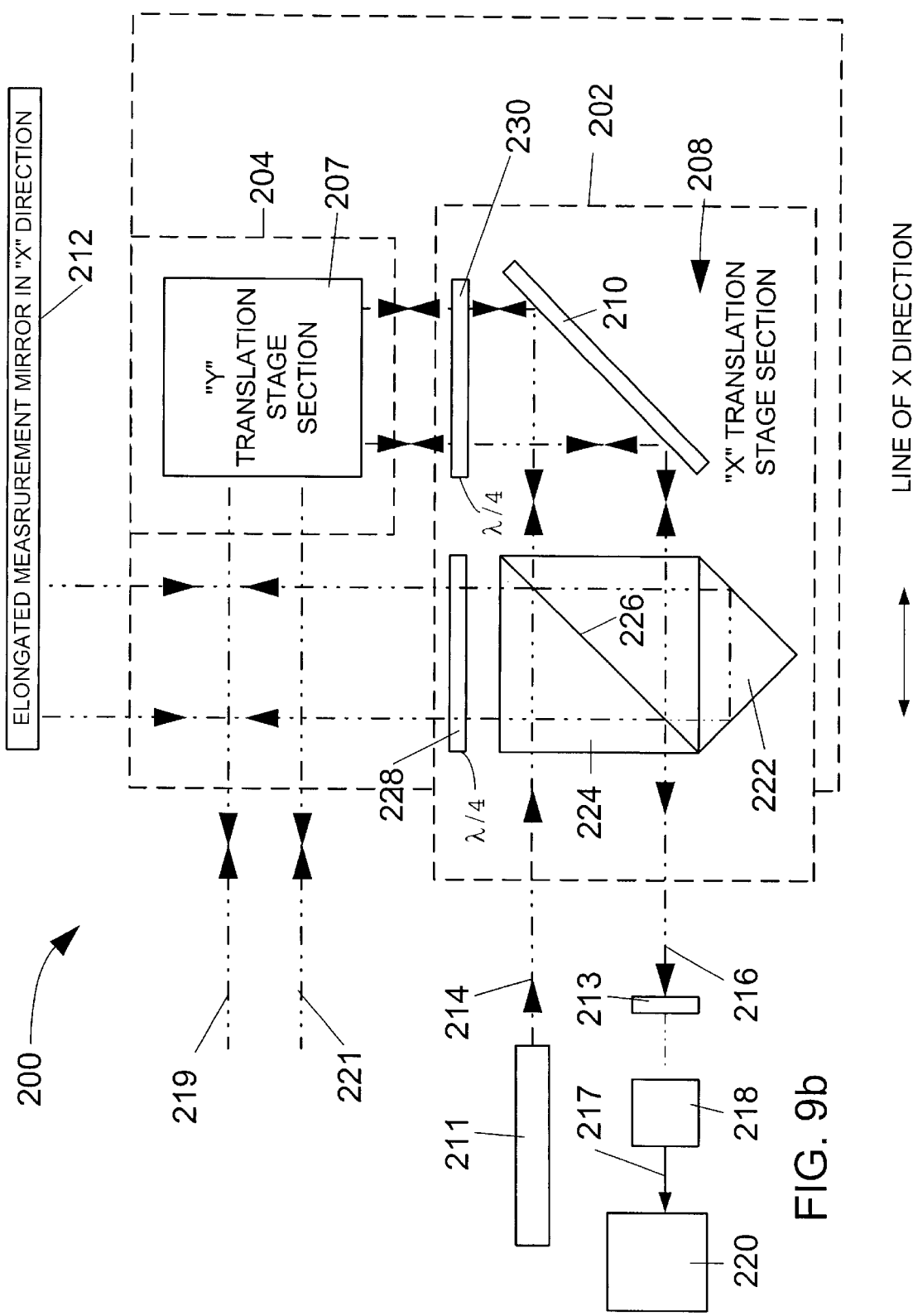
FIG. 9b is a diagrammatic elevational view of an embodiment of the stage-mounted interferometer of FIG. 9a and comprises a folded HSPMI that utilizes coextensive orthogonally polarized reference and measurement beams.

Interferometer 208 is preferably of the HSPMI type and may be operated in one of two modes to be described in connection with FIGS. 9b and 9c, respectively. Referring now to FIG. 9b which shows a more detailed diagrammatic elevational view of an embodiment of the stage-mounted interferometer 208 of FIG. 9a and comprises a folded HSPMI that utilizes coextensive orthogonally polarized reference and measurement beams. As seen there, an off-stage source 211 provides an input beam 214 comprising a pair of orthogonally polarized beams of different frequency as previously described. Beam 214 may be provided in the intervening free space between the source and x-translation stage 202 or may be provided via a fiber delivery system having an output end that travels with the x-translation stage 202. A return beam 216 exits interferometer 208, traveling through a mixing polarizer 213 to a detector 218 which generates and electrical signal 217 that is analyzed to convert phase information to altitude changes.

As seen in FIG. 9b, interferometer 208 comprises a polarizing beam splitter 224 having a PBS layer 226 and a retroreflector 222 optically attached to the bottom surface of the polarizing beam splitter 224. Positioned on the right output facet of polarizing beamsplitter 224 is a fold mirror 210 that directs beams to and from mirror 207 via a quarter-wave plate 230. Mounted above the top surface of polarizing beam splitter 224 is another quarter-wave plated 228 that is in the path of beams traveling to and from elongated measurement mirror 212.

To measure the x-position or changes in x-position of x-translation stage 202 a separate off-stage interferometer may be used to generate and receive input and output beams 219 and 221, respectively, that interact with vertical surface 207 of mirror 206, the vertical surface serving as a plane object mirror in a well-known manner.

The generation of input beam 214, output beam 216, and the operation of interferometer 208 as a folded HSPMI with polarization encoded measurement and reference beams will be well-understood to those skilled in the art and is explained in detail in the aforementioned Zanoni paper so will not be discussed in further detail here. However, the measurement of changes in altitude between the off-stage mirror 212 and mirror 207 is a consequence of the particular architecture which involves locating the HSPMI on the x-translation stage so that it can simultaneously see the elongated mirror 212 and the underside of mirror 207 and the x and y translation stages move. This particular arrangement additionally allows the use of small quarter-wave plates and results in a compact on-stage interferometer with its attendant advantages.

Figure 9C:
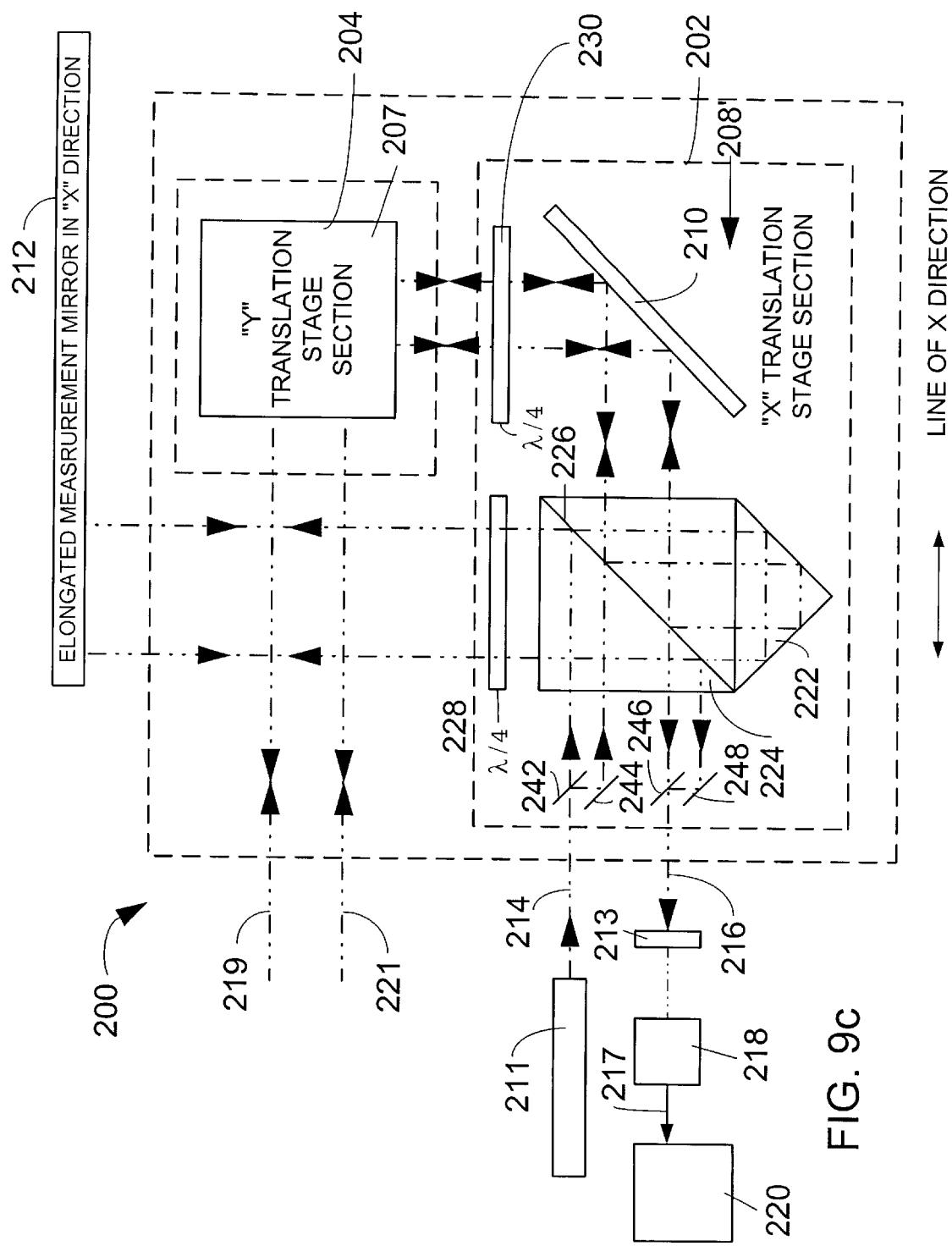
FIG. 9c is a diagrammatic elevational view of an alternative embodiment for the stage-mounted interferometer of FIG. 9a and comprises a folded HSPMI that utilizes orthogonally polarized and spatially separated reference and measurement beams.

FIG. 9c is a diagrammatic elevational view of an alternative embodiment for the stage-mounted interferometer 208' of FIG. 9a and comprises a folded HSPMI that utilizes orthogonally polarized separated reference and measurement beams. In this embodiment, the input beam has orthogonally polarized beam components that are spatially separated through the use of a polarizing beam splitter 242 which directly transmits one of the components to the beam splitter 224 while reflecting the other vertically downward to a fold mirror 244 which then directs the second component to beam splitter 224. The separated orthogonally polarized beam components serve as reference and measurement beams in a well-known manner as they transit the interferometer 208'. After transiting the interferometer 208', the measurement and reference components are recombined for travel as components of output beam 216 via a fold mirror 248 and a polarizing beam splitter 246. Output signal 216 is transformed to an electrical signal 217 via polarizer 213 and detector 218 after which altitude changes are determined via electronic signal processor 220.

Figure 10A:
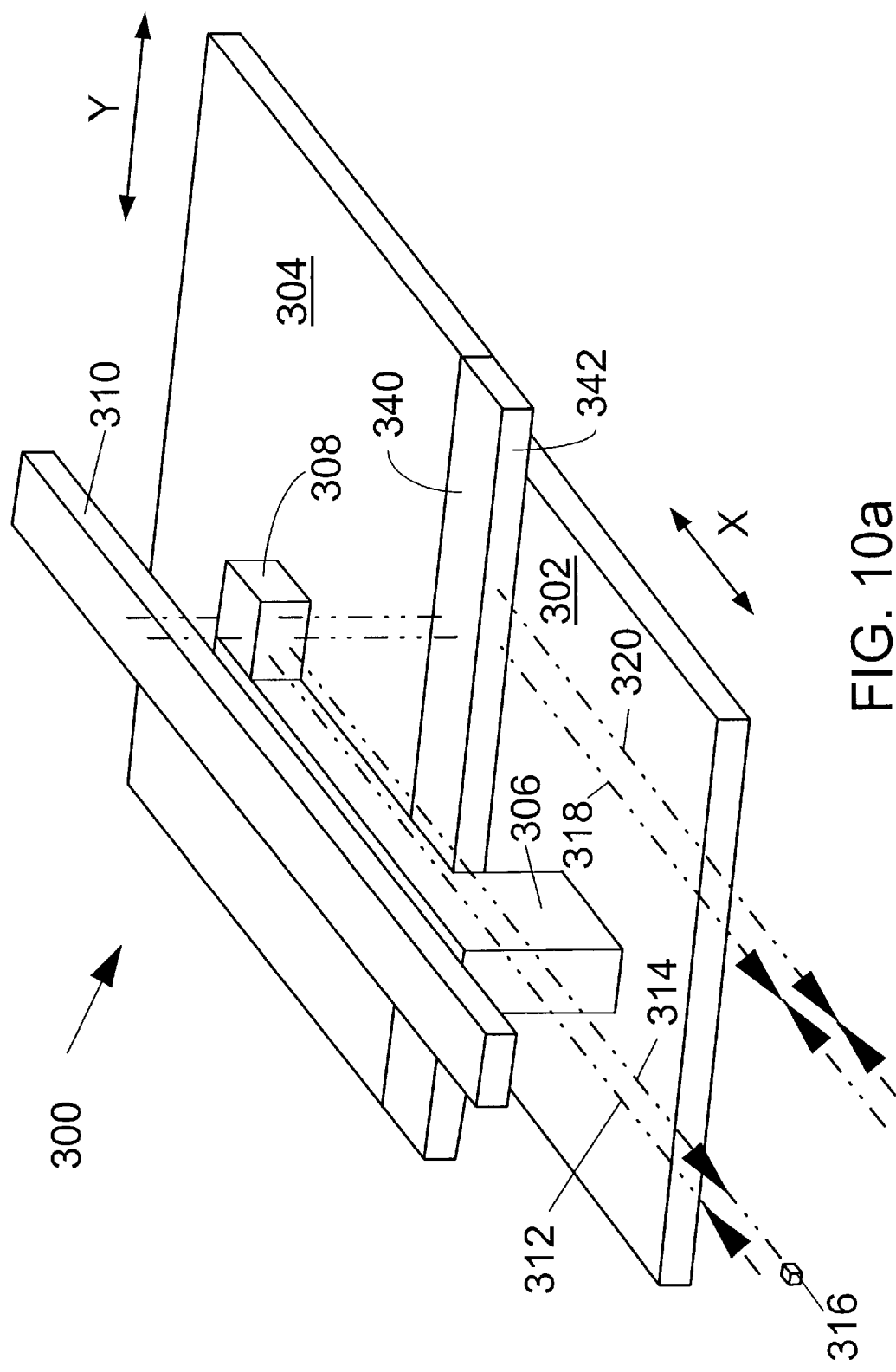
FIG. 10a is a diagrammatic perspective view of an ninth embodiment of the invention that utilizes an interferometer that employs quarter-wave plates and is mounted on one translation stage of a photolithographic stepper or the like to measure the variation in altitude between the top surface of another translation stage and an elongated off-stage mirror.

Reference is now made to FIG. 10a which shows a diagrammatic perspective view of an ninth embodiment of the invention that utilizes an interferometer that employs quarter-wave plates and is mounted on one translation stage of a photolithographic stepper or the like to measure the variation in altitude between the top surface of another translation stage and an elongated off-stage mirror.

As seen in FIG. 10a, the ninth embodiment is depicted as a system 300 whose major components comprise an x-translation stage 302, a y-translation stage 304, an interferometer 308 that is mounted to the x-translation stage 302 via a dimensionally stable bracket 306 so that it is between certain elements of the y-translation stage 304 and an off-stage mounted elongated mirror 310.

Y-translation stage 304 is provided with an elongated mirror 340 having a upper surface that is optically finished to required tolerances and also has a vertically oriented elongated facet 342 in the y-z plane. Input and output beams 318 and 320 can interact with facet 342 via an off-stage mounted interferometer to measure the position or changes in position of the x-translation stage 302, the vertical facet 342 acting as an object mirror in a well-known manner.

Figure 10B:
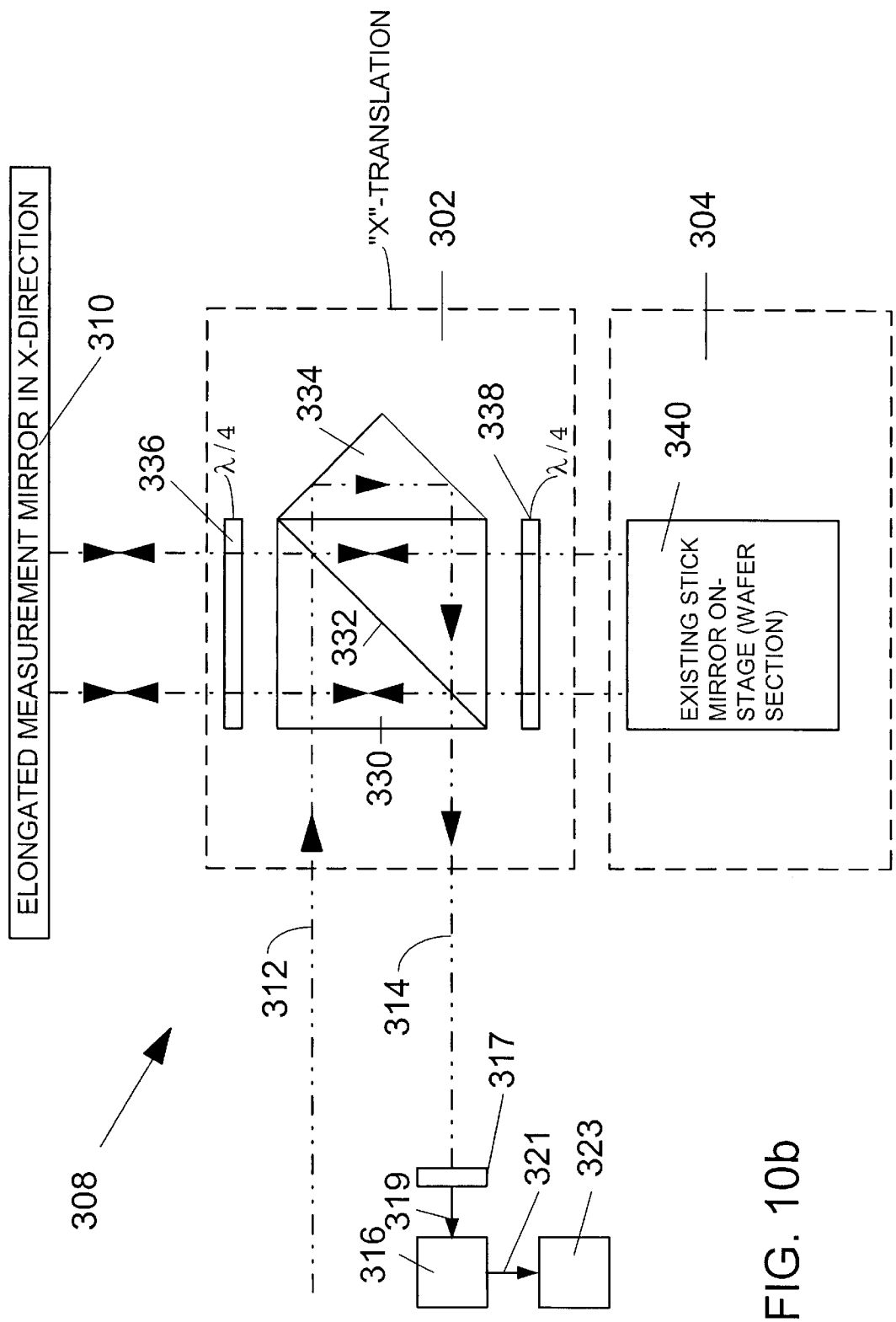
FIG. 10b is a diagrammatic elevational view of the interferometer of FIG. 10a shown with parts missing for purpose of simplifying its description.

Reference is now made to FIG. 10b is a diagrammatic elevational view of the interferometer 308 of FIG. 10a along with selected other elements of system 300 but otherwise shown with parts missing for purpose of simplifying its description. As seen there, interferometer 308 comprises a beam polarizing beam splitter 330 having a PBS layer 332, a corner cube 334 or polarization preserving optical system, a pair of quarter-wave plates 336 and 338 that are positioned above and below the top and bottom surfaces of the polarizing beam splitter 330, respectively. An input beam 312 comprising coextensive orthogonally polarized beam components enters the interferometer 308 and transit it as polarization encoded measurement and reference beams that are recombined as components of exit beam 314. Exit beam 314 is sent through a mixer 317 to generate a mixed output beam 319 that contains phase information representative of changes in altitude between the bottom surface of mirror 310 and the top surface of mirror 340 as x and y translations stages, 302 and 304, move with respect to one another. Mixed output beam 319 is sent to a detector 316 which converts it an electrical output signal 321. Electrical output signal 321 is then sent to an electronic analyzer 321 where changes in altitude are electronically determined. It will be apparent that the reference and measurement paths need to balanced in optical path length in glass and to do this the reference leg may be sent through additional glass which has been omitted to simply the foregoing explanation.

Figure 11:
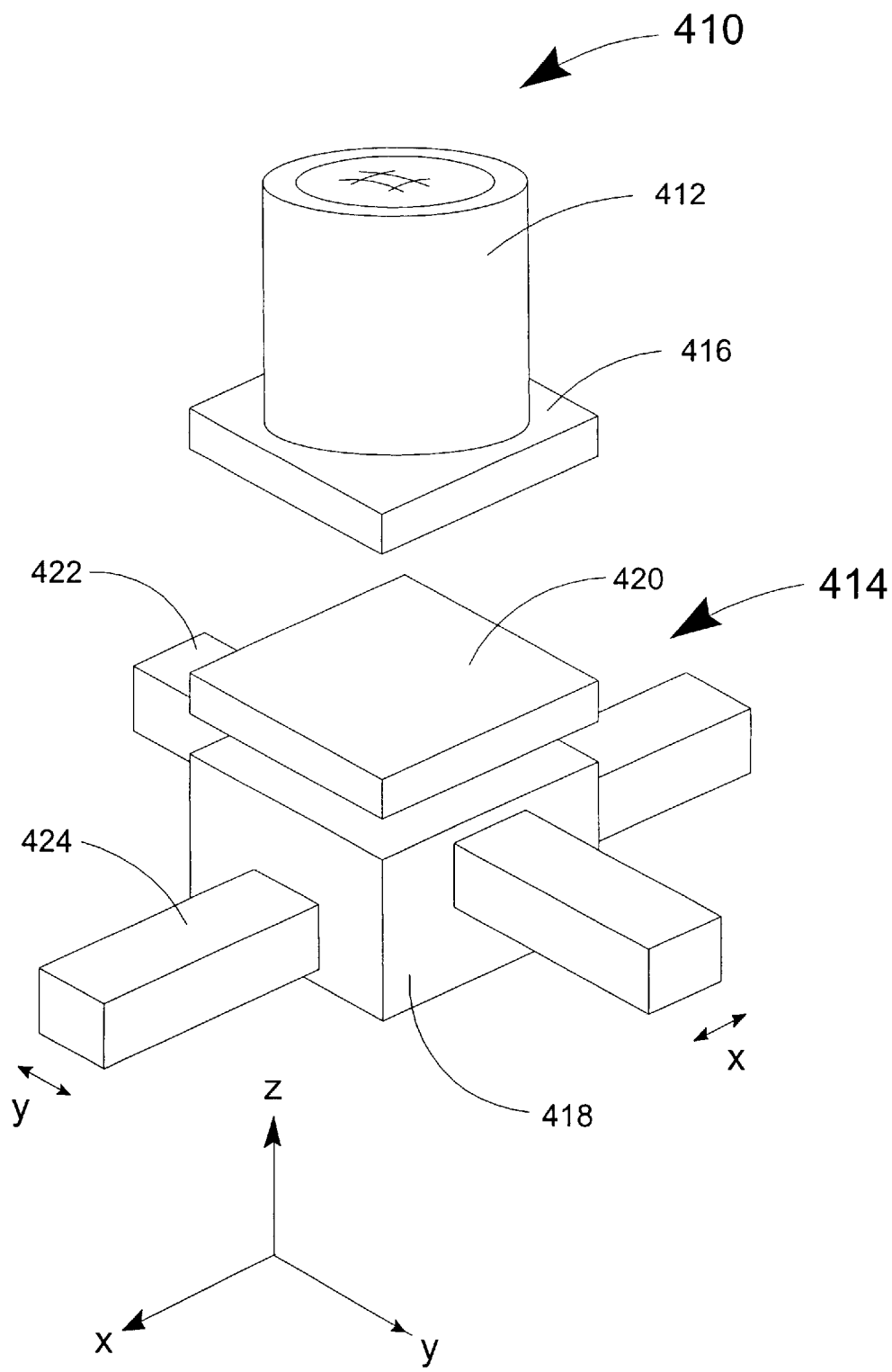
FIG. 11 is a diagrammatic perspective view of a photolithographic stepper or scanning system in which downward looking embodiments of the invention may be incorporated for the precision measurement of the altitude of its optical projection system with respect to the surface of a wafer, the view showing coarse and fine stages along with drive bars for positioning the coarse stage.

Reference is now made to FIG. 11 showing in diagrammatic perspective a photolithographic stepper 410 in which downward looking embodiments of the invention may be incorporated to precisely measure the altitude between an optical projection system 412 and a wafer stage system generally designated at 414. The optical projection system 412 is fixedly attached to a plate 416 that is attached to the reference frame 11 as before in connection the description of stepper 10 of FIG. 1.

The wafer stage system comprises a coarse stage 418 atop of which sits a fine stage 420 that carries a wafer. The horizontal position of the coarse stage 318 is determined by an x-drive bar 422 and a y-drive bar 424. x and y drive bars, 422 and 424 are coupled with coarse stage 418 by air bearings (not shown), and coarse stage 418 rides on air bearings in the x-y plane. Fine stage 420 is moved with respect to coarse stage 418 to precisely position a wafer with respect to the optical projection system 412 in the x-y-z plane. For this purpose, fine stage is provided with well-known means by which it has six degrees of freedom, three translation and three rotation.

While simplified, system 410 is shown in sufficient detail to provide an understanding of how the generally downward looking embodiments of the invention can be incorporated therein to provide information about critical dimensional relationships in system 410 as it is employed to fabricate semiconductor devices. In the various downward looking embodiments that may be incorporated in system 410, it should be kept in mind that they may exist on one or more axes or that more than one may be associated with a single axis in hand off arrangements where one would monitor position along that axis for some predetermined distance and then another would pick up to cover another predetermined distance with some overlap of the two predetermined distances covered.

Figure 12A:
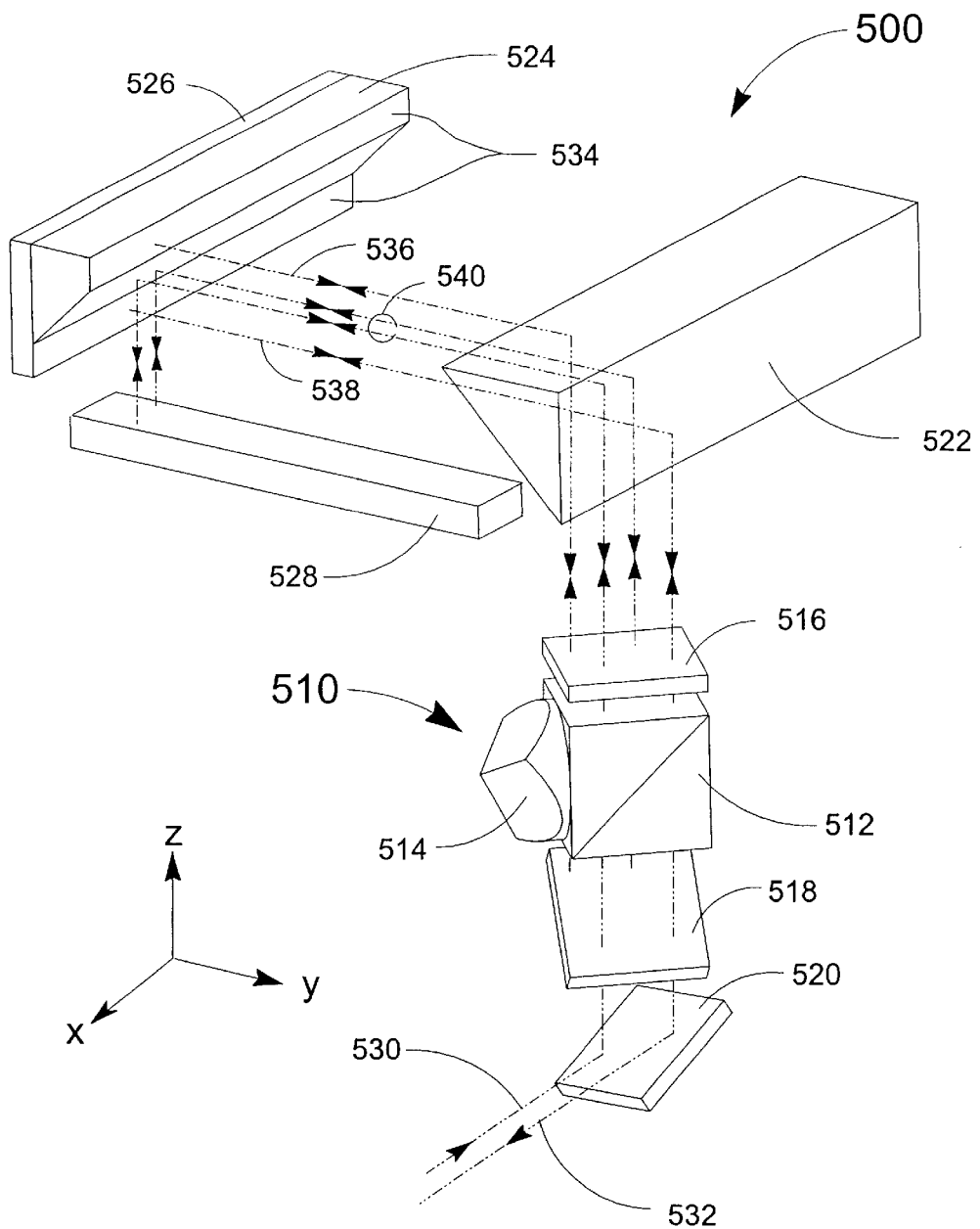
FIG. 12a is a diagrammatic perspective view of a downward looking embodiment of the invention in which its differential plane mirror interferometer and input mirror are attached to a coarse stage drive bar.

Reference is now made to FIG. 12a which shows in diagrammatic perspective a downward looking (downward looking in the sense that the last segment of the measurement beam(s) initially impinge on the wafer stage or its surrogate from the perspective of the optical projection system) system 500 that comprises a differential plane mirror interferometer 514 that is attached to a drive bar of the coarse stage 418 and includes a polarizing beam splitter (PBS) 512, a retroreflector 514 attached to the left facet of the PBS 512, a quarter wave plate 516 mounted above the top facet of the PBS 512, a shear plate and beam splitter 518 located below the bottom facet of the PBS 512 and an input turning mirror 520 located beneath shear plate and beamsplitter 518.

Above the quarter wave plate 516, there is an elongated prismatic element 522 that is fixedly attached to the reference frame 11 and directly across from prismatic element 522 is another prismatic element 524 that is attached to a plate 526 that, in turn, is also fixedly attached to reference frame 11. Below element 524 if an elongated bar mirror 528 that is fixedly attached to the finely controlled wafer stage 420.

As before, an input beam 530 enters the interferometer 510 after being deflected upwardly by turning mirror 520, and output beam 532 is directed to suitable detection and signal processing means as before. Measurement beams 540 proceed from interferometer 510 to bar mirror 528 via the angled facets of elongated prismatic elements 522 and 524 and reference beams 536 and 538 proceed from interferometer 510 to references surfaces 534 also via the angled facet of elongated prismatic element 522.

In operation of system 500, the stage is moving in x and y, but there is no relative motion between the bar mirror 528 on the stage 420 and the measurement beams 540 in the x-direction because the interferometer 514 tracks the stage for motions in the x-direction since they are locked together. As the x-drive bar 422 moves, it carries the interferometer 514 as it moves in the x-direction. Accordingly, the measurement beam 540 is moving in the x-direction, and it is moving at exactly the same rate as the stage since the stage is locked to the x-drive bar 422. So the bar mirror 528 on the stage 420 is moving substantially along with the interferometer 514 in the x-direction the coarse stage 418 is moving tightly and then the fine stage 420 is on top with its own fine adjustments, but nevertheless is locked in the x-direction. However, in the y-direction, the stage moves, and that is why there has to be a bar in the y-direction. In other words in the y-direction, the measurement beams 540 coming down are fixed in the y-direction. But the stage is not fixed in the y-direction.

If it were desired to do this in the x-direction, one would have the option of using another interferometer and a whole set of mirrors. In addition, one could actually duplicate this arrangement to cover motion in one direction and then by going to the other half of the wafer one can put one of these systems on the other side of the wafer and have them handshake. That is, they would overlap in part of the range to cover the full dynamic range.

System 500 is a polarizing interferometer and has the characteristics that it is insensitive (it's a double pass interferometer) both for the reference and measurement beams because the output beams, the reference and measurement beams, are parallel. There may be some shear between them if the bar mirror changes angle, but it is only lateral shear, and there is no angular relative change. Moreover, no information about the speeds in the x and y directions are needed since because z is being measured directly. In addition, the interferometer 510 can move up and down, and this motion doesn't change the distance being measuring because it is a DPMI. Furthermore, small rotations, such as those induced by vibration, are tolerable, which is important because the drive bar is being driven by forces acting to accelerate the mass of the stage.

Figure 12B:
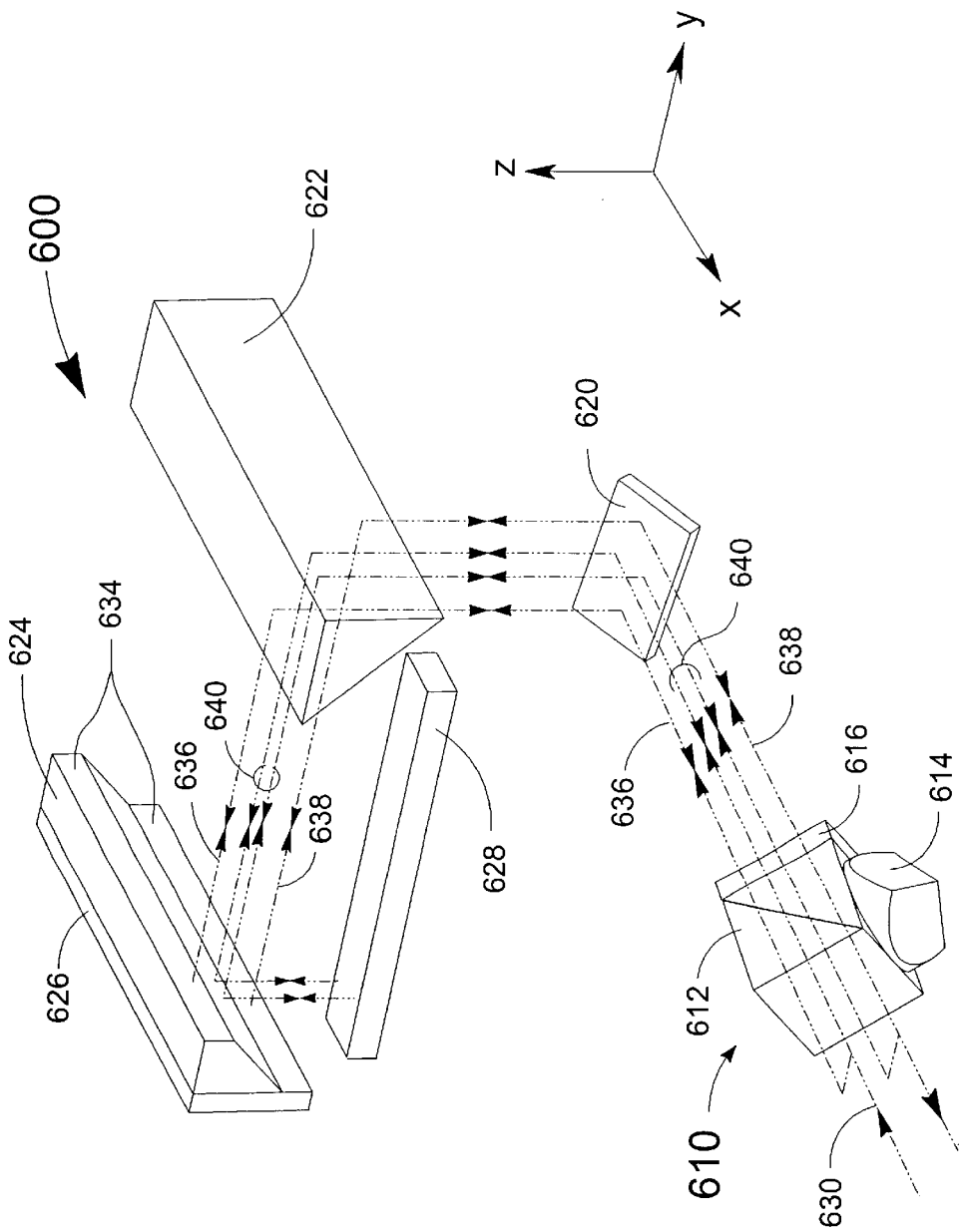
FIG. 12b is a diagrammatic perspective view of an embodiment of the invention similar to that shown in FIG. 12a but having its differential plane mirror interferometer mounted on neither the coarse of fine stages of the stepper.

Reference is now made to FIG. 12b, which shows another embodiment of a downward looking interferometric apparatus for measuring altitude between the optical projection system and wafer. Here, the apparatus is designated generally as 600 and is seen to comprise a differential plane mirror interferometer 610 including a polarization beam splitter 612, a retroreflector 614 and a quarter-wave plate 612. Located up stream of interferometer 610, but not shown, is a beam splitter and shearing system for forming input beams and combining output beams.

Downstream of interferometer 610 is a turning mirror 620 for redirecting beams to travel to and from an elongated prismatic element 622 that is rigidly attached to the reference frame 11. Across from and facing prismatic element 622 is an elongated plate 626 that is also attached to the reference frame 11. Attached to plate 626 is a prismatic element 624. Flat surfaces 634 on plate 626 and prismatic element 624 serve as reference surfaces.

Attached to the fine control wafer stage 420 is an elongated bar mirror 628. The beam splitter 610 is located off of the drive bar and only the fold mirror 620 remains on the same drive bar as in FIG. 12a. Therefore, the fold mirror 620 moves with the drive bar that translates in the x-direction, i.e. the same drive bar as in FIG. 12a while the interferometer 610 is fixed in the reference frame of the tool.

Here the input and output beams are shown as 630 and 632, respectively, the reference beams are 636 and 638, and the measurement beams are 640. Otherwise, the operation is like that of the embodiment of FIG. 12a. An advantage of this embodiment is that there is very little mass on the drive bar, just the fold mirror 620. Its disadvantage is that there is an extra length where air turbulence might come in, but all of the properties of immunity that are present in the embodiment of FIG. 12a are present in that of FIG. 12b.

Figure 12C:
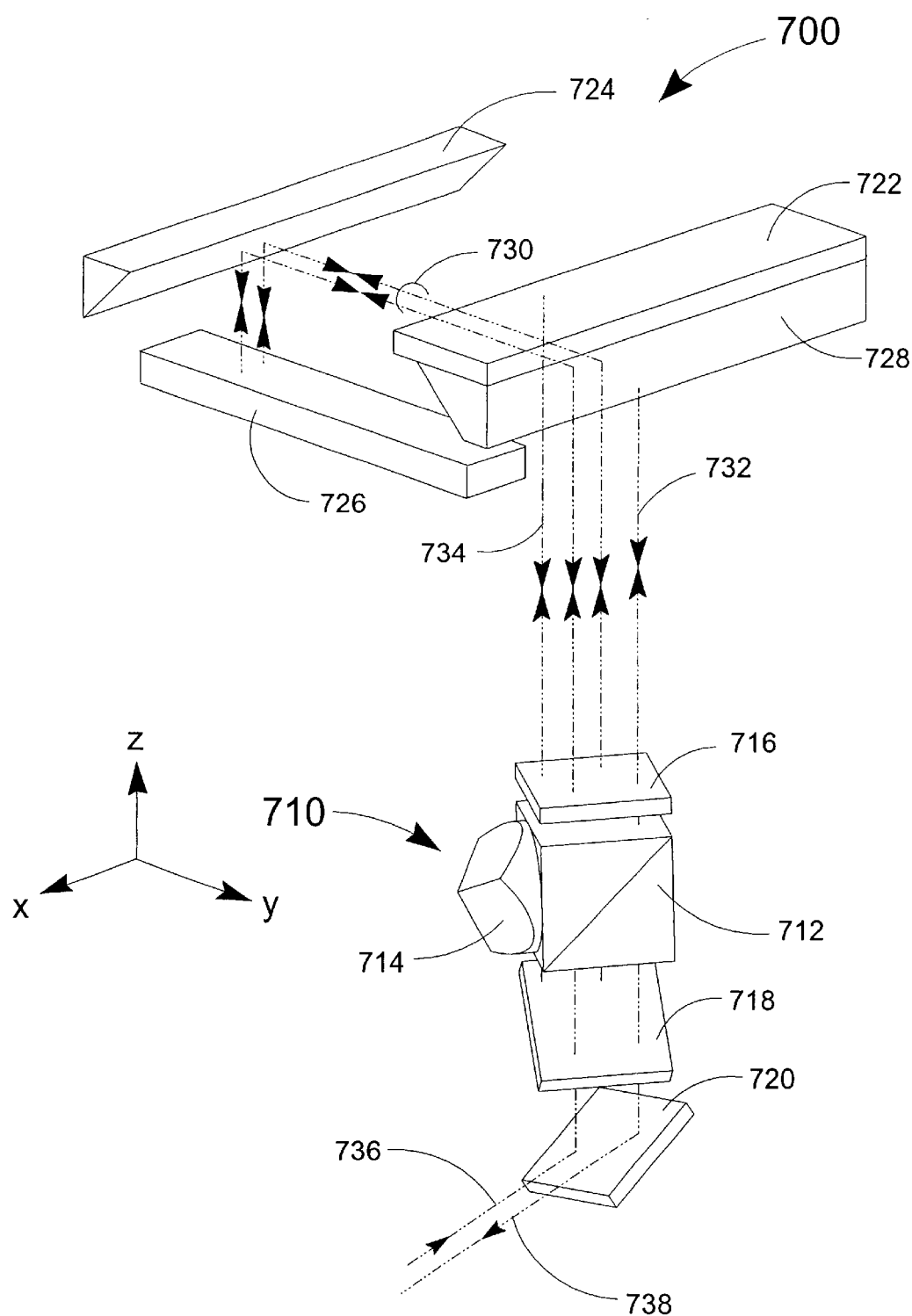
FIG. 12c is a diagrammatic perspective view of yet another downward looking embodiment in which its differential plane mirror interferometer is attached to a coarse stage drive bar.

Reference is now made to FIG. 12c which shows another downward looking interferometric apparatus generally designated at 700. Apparatus 700 comprises a differential plane mirror interferometer 710 including a polarizing beam splitter 712, a retroreflector 714, and a quarter-wave plate 716. Beneath PBS 712 is a beamsplitter and shearing plate 718 and beneath that is an input turning mirror 720. Attached to reference frame 11 is an elongated flat plate 722 and an elongated prismatic element 724. To plate 722 is attached an elongated prismatic element 728. Flats on prismatic element 728 and plate 722 serve as reference surfaces. An elongated bar mirror 726 is attached to fine control wafer stage 420.

Input and output beams are 736 and 738, respectively, and reference beams are designated as beams 732 and 734 while measurement beams are shown as 730. Essentially everything that applies to the embodiment of FIG. 12a also applies to the embodiment of FIG. 12c except the embodiment of FIG. 12c is a DPMI with the interferometer beamsplitter system that is located on the same bar that translates in the x-direction. The only difference is that now the reference mirror is located at the first elongated prismatic element at the top instead of the second elongated prismatic element. So this embodiment measures the total distance z plus the y distance between the two prismatic elements. However, since those two prismatic elements are fixed, it is still measuring essentially only z. What may be lost with this embodiment is that, if the space between the two elongated prismatic elements is changing, i.e., the main frame is expanding in the y direction, and that change isn't compensated (in FIG. 12a it is compensated) small errors could arise. However, this embodiment has the advantage of reduced turbulence effects in the reference beam because it doesn't go between the bar mirrors but only between the interferometer and the first bar mirror.

Figure 12D:
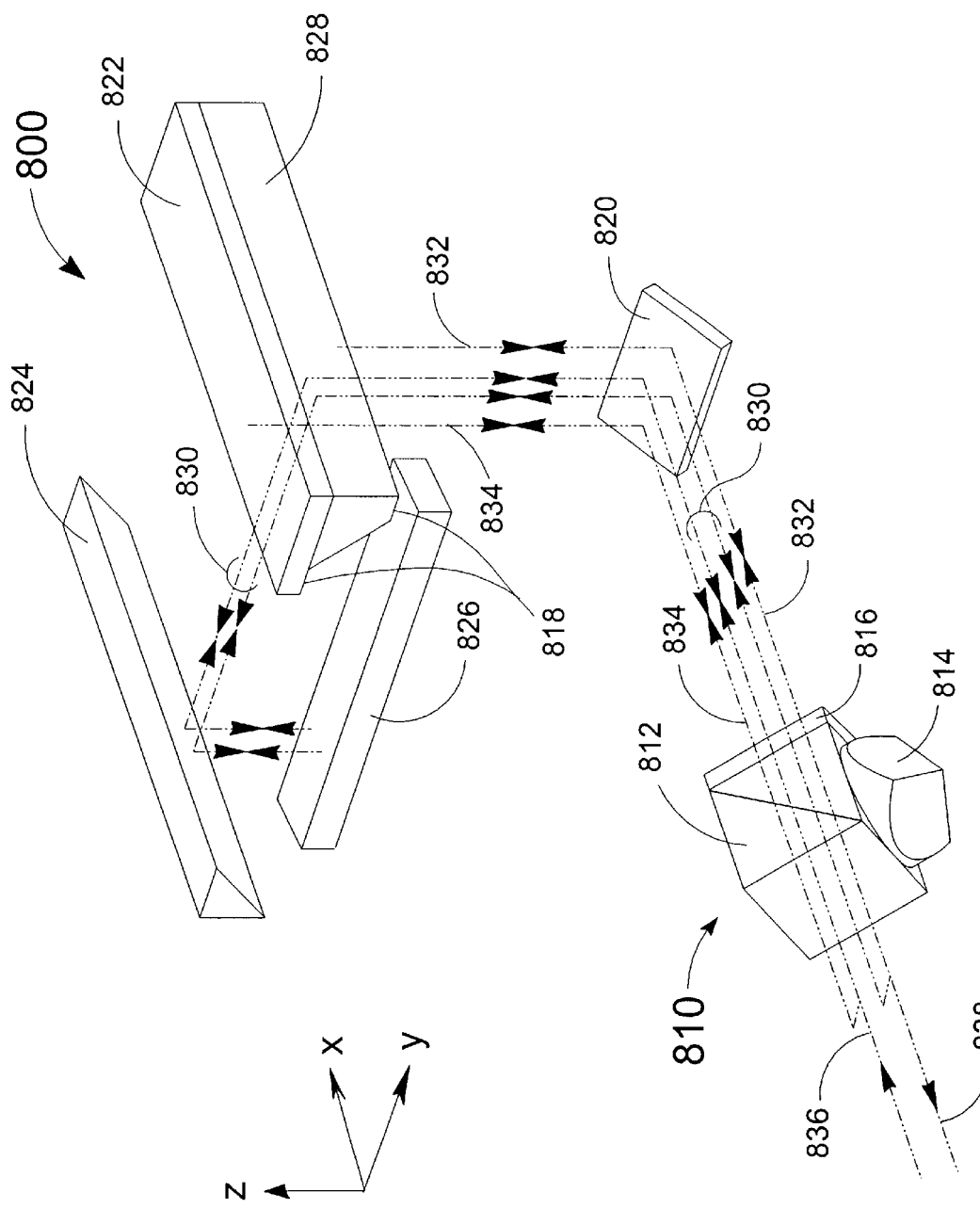
FIG. 12d is an embodiment similar to that of FIG. 12c except that its interferometer is mounted on neither the coarse or fine stage of the stepper.

Reference is now made to FIG. 12d, which shows still another downward looking apparatus 800. Apparatus 800 comprises a differential plane mirror interferometer 810 that is on the reference frame 11 and not on either the coarse or fine stages, 418 or 420, respectively. Interferometer 810 comprises a polarizing beam splitter 812, a retroreflector 814, and a quarter-wave plate 816. The input beam is shown at 836, and the output beam at 838. The input beam 836 is split by a shear plate, and the output beams are recombined by the same shear plate which is not shown but well understood.

The reference beams are 832 and 834 and the measurement beams are at 830. An input turning mirror 820 provides an upward path for all of the beams to a first elongated bar assembly comprising an elongated plate 822 attached to the reference frame 11 and an elongated prismatic element 828 attached to the elongated plate 822. Flats 818 on these elements serve as the reference surfaces.

Measurement beams 830 proceed to an elongated bar mirror 826, which is attached to the fine control wafer stage 420, via an elongated prismatic element 824 that is also attached to the reference frame 11. Here, the input folding or turning mirror 820 is located on the drive bar as in the embodiment of FIG. 12b. The reference mirror is the first elongated bar mirror assembly comprising the flats 818. The embodiment of FIG. 12d is to that of FIG. 12c as the embodiment of FIG. 12b is to that of FIG. 12a.

Figure 13A:
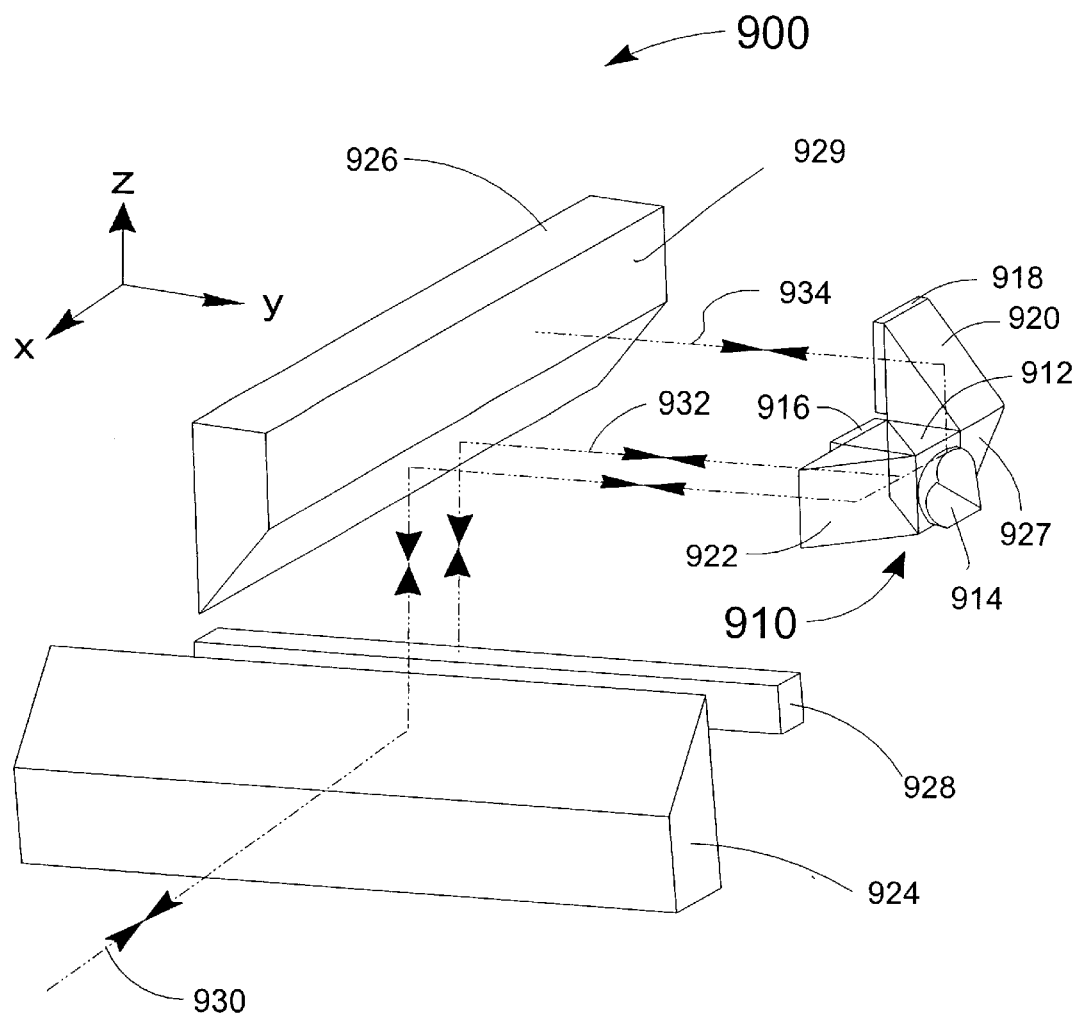
FIG. 13a is yet another example of a downward looking embodiment in which the interferometer is mounted to the coarse x-y stage.

Referring now to FIG. 13a, there is shown a downward looking apparatus 900 comprising an interferometer 910 that is attached to the coarse x-y stage 418. Interferometer 910 comprises a polarizing beam splitter 912, an input fold prism 922, a retroreflector 914, prismatic turning elements 927 and 920, and quarter-wave plates 916 and 918.

Attached to the coarse x-y stage 418 is an elongated turning bar 924 and to the reference frame 11 is an elongated prismatic element 926 that also includes a flat section 929 that serves as a reference surface for interferometer 910. Mounted to the fine x-y stage 420 is an elongated bar mirror 928. The input and output beam path is designated at 930. The input beam travels to the interferometer 910 where it is split at the PBS 912 for travel as reference beam 934 to reference flat 929 and as measurement beam 932 for travel to elongated stage bar mirror 928. Reference and measurement beams are also recombined via interferometer 910 for travel back along the same path along which they entered interferometer 910 as output beam 930.

Figure 13B:
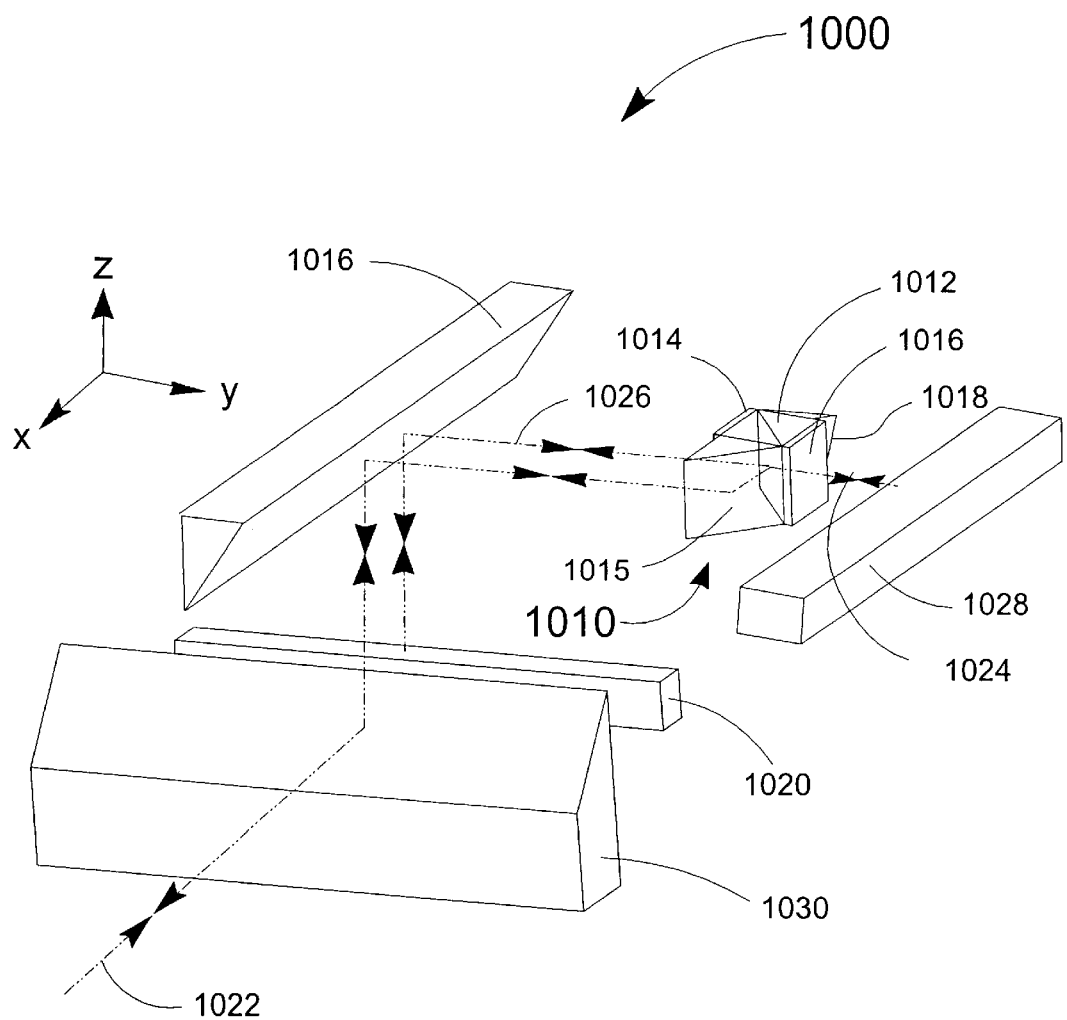

FIG. 13b shows a variation on the embodiment of FIG. 13a. Here, a downward looking apparatus 1000 comprises a differential plane mirror interferometer 1010 including a polarizing beam splitter 1012, a retroreflector 1018, an input fold prism 1015, and quarter-wave plates 1014 and 1016.

An elongated fold bar 1030 is attached to the coarse x-y stage 418, and an elongated fold mirror 1016 is attached to reference frame 11. Also attached to reference frame 11 is an elongated bar mirror 1028 that serves as the reference surface for interferometer 1010. On the fine x-y stage 420 is attached an elongated bar mirror 1020. Input and output beams 1022 travel along the same path to and from interferometer 1010 where they are split and recombined as reference beam 1024 and measurement beam 1026.

Figure 14:
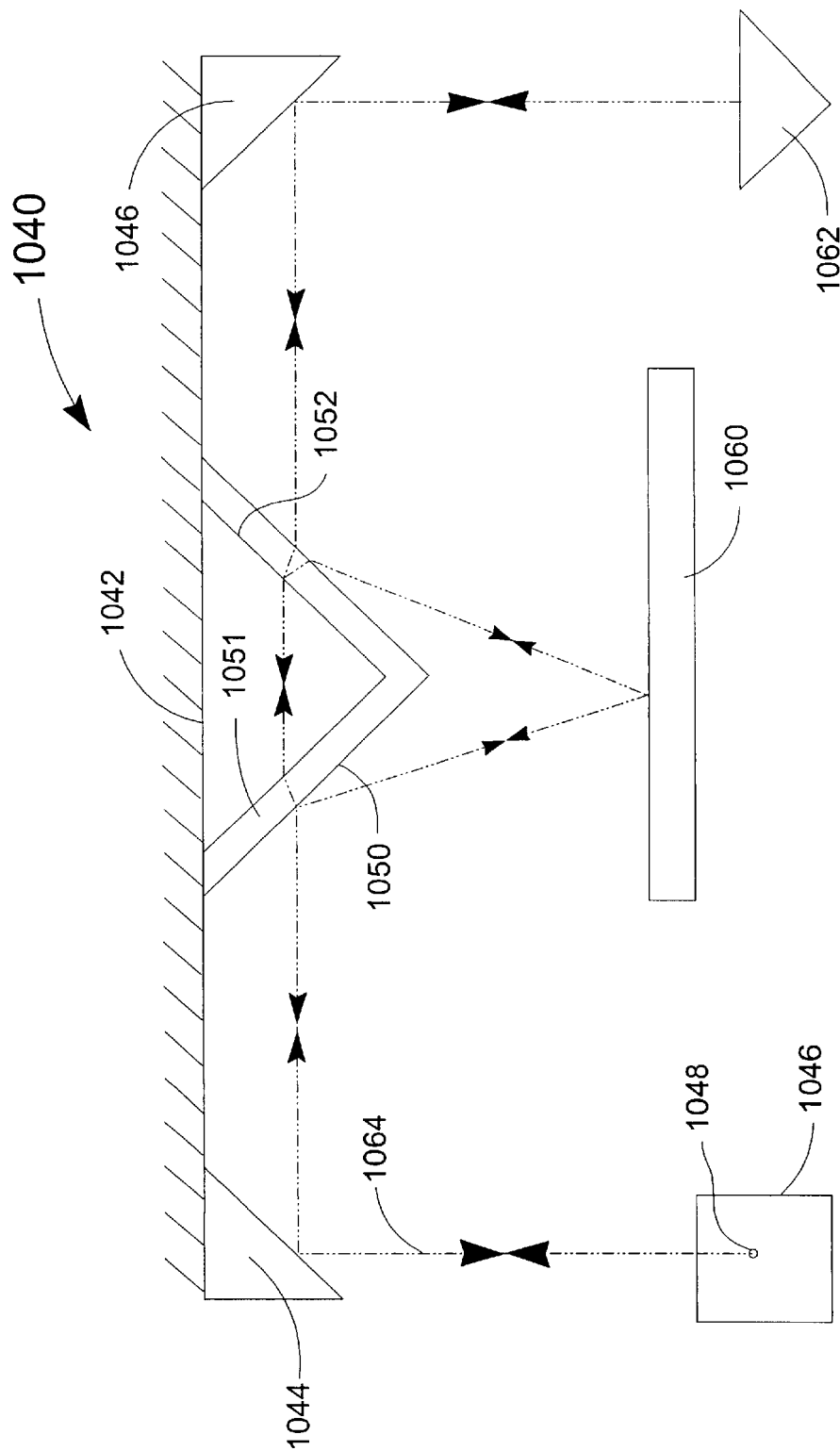
FIG. 14 is an elevational view of an inverted version of the embodiment of FIG. 6.

Reference is now made to FIG. 14 which shows an apparatus 1040 that is essentially the inverted version of the embodiment of FIG. 6. Here, the reference frame is designated at 1042 to which is attached elongated bar prisms 1044 and 1046. An elongated bar mirror 1060 is attached to the fine control wafer stage 420, a retroreflector 1062 is attached to a coarse stage drive bar. Between bar prisms 1044 and 1046 is a prismatic reflector and polarizing beam splitter 1051 that carries PBS layers 1050 and 1052. A right angle prism 1046 is attached to coarse stage 418, and the input and output beam path is as shown by 1048. This embodiment operates essentially in the reverse manner as that of FIG. 6 except that it looks downwardly at the wafer stage 420.

Having described the various embodiments, it will be obvious to those skilled in the relevant art how to make additional changes based on the teachings of the invention and all such changes are intended to be within the scope of the invention.

What is claimed is:

1. Interferometric apparatus for measuring changes in altitude between a surface and a datum line, said apparatus comprising:

a dimensionally stable metrology frame;

at least one photolithographic translation stage for holding a wafer in an exposure position, said photolithographic translation stage being mounted for nominally plane translation with respect to said metrology frame in at least two orthogonal directions while experiencing relatively smaller changes in altitude in a direction nominally normal to said at least two orthogonal directions, said photolithographic translation stage comprising means for defining a datum line in said photolithographic translation stage;

elongated reflector means mounted with respect to said metrology frame to provide said surface; and at least one interferometer system mounted at least in part on said photolithographic translation stage for movement therewith, said interferometer system comprising a source, a reference path mounted off said photolithographic translation stage, and a measurement path including a constant deviation prism mounted for movement with said photolithographic translation stage intermediate said source and said elongated reflector means, said source being structured to provide reference and measurement beams for travel, respectively, along said reference and measurement paths to provide a signal containing information that varies in accordance with said changes in altitude between said surface and said datum line as said photolithographic translation stage moves, said elongated constant deviation prism being operative to make said signal insensitive to variations in angular rotation of said photolithographic translation stage at least about one of said two orthogonal directions.

2. The apparatus of claim 1 wherein said measurement path comprises at least one fold.

3. The apparatus of claim 1 further including means for receiving said signal and determining said altitude therefrom.

4. The apparatus of claim 1 wherein said constant deviation prism comprises an elongated Penta prism fixedly mounted on said photolithographic translation stage.

5. The apparatus of claim 4 wherein said elongated reflector means comprises a roof prism whereby said signal is insensitive to angular rotations in said photolithographic translation stage at least about two of said orthogonal directions.

6. The apparatus of claim 1 wherein said interferometer system comprises a beam generator and a detector mounted off of said photolithographic translation stage and an interferometer mounted on said photolithographic translation stage.

7. The apparatus of claim 6 further comprising a second photolithographic translation stage mounted for movement with respect to said first photolithographic translation stage such that one of said photolithographic translation stages moves above the other and both move in orthogonal directions, said interferometer system being configured to measure the difference in altitudes from each of said photolithographic translation stages to said datum line.

8. The interferometric apparatus of claim 1 further including a microlithographic means operatively associated with said interferometric apparatus for use in fabricating integrated circuits on a wafer, said microlithographic means comprising:
   at least one stage for supporting a wafer;
   an illumination system including a radiation source, a mask, a positioning system, a lens assembly, and predetermined portions of said interferometric apparatus,
   said microlithographic means being operative such that the source directs radiation through said mask to produce spatially patterned radiation, said positioning system adjusts the position of said mask relative to radiation from said source, said lens assembly images said spatially patterned radiation onto the wafer, and said interferometric apparatus measures the position of said mask relative to said radiation from said source.

9. Interferometric apparatus for directly measuring changes in altitude between points along a datum line on an object and corresponding points along a datum line on a displaced reference body, said apparatus comprising:
   means for defining an object mounted for nominally plane translation with respect to said reference body in at least two orthogonal directions while experiencing relatively smaller changes in altitude in a direction nominally normal to said at least two orthogonal directions;
   elongated reflector means mounted with respect to said reference body;
   a source for generating an input beam that is initially parallel to said object plane of motion; and
   at least one interferometer system mounted at least in part on said object for movement therewith, said interferometer system comprising at least one multifaceted reflecting assembly structured to be scanned by said input beam along a collection of points representing an object datum line and provide a measurement beam that travels along an optical path part of which is folded to and from said elongated reflector means and the remaining part of which is parallel to said object plane of motion, scanning said elongated reflector means along a collection of points corresponding to those on said object datum line to define a reference body datum line associated with said reference body, said interferometer system providing a signal containing information that varies directly in accordance with only the altitude between said object and reference body as said object moves, said interferometer system being configured so that said signal is insensitive to variations in angular rotation of said object at least about one of said two orthogonal directions and such that said signal variation is decoupled from movement along at least one of said orthogonal directions.

10. The interferometric apparatus of claim 9 wherein said interferometer system multifaceted reflecting assembly comprises at least one multifaceted prism assembly fixedly mounted to said object and elongated in a direction nominally normal to the direction of propagation of said input beam.

11. The interferometric apparatus of claim 10 wherein said multifaceted prism assembly further comprises polarizing beam splitter layers located on selected ones of its facets.

12. The interferometric apparatus of claim 11 wherein said interferometric system further includes a reflecting member mounted off of said object and wherein said source is also mounted off of said object.

13. Interferometric apparatus for measuring changes in altitude between an object and a datum line, said apparatus comprising:
   a dimensionally stable metrology frame having a reference surface containing a datum line;
   at least one object mounted for nominally plane translation with respect to said metrology frame in at least two orthogonal directions while experiencing relatively smaller changes in altitude in a direction nominally normal to said at least two orthogonal directions;
   elongated reflector means fixedly mounted with respect to said object for movement therewith, said elongated reflector means lying in a plane substantially parallel to the plane in which said object translates; and
   at least one interferometer system mounted at least in part on said dimensionally stable metrology frame, said interferometer system comprising a source for generating reference and measurement beams, said interferometer system having a reference path along which said reference beam travels to and from said reference surface and a measurement path along which said measurement beam travels to said elongated reflector means, striking it at normal incidence and returning therefrom to be combined with said reference beam to provide a signal containing information that varies in accordance with said changes in altitude between said object and said datum line as said object moves, said interferometer system being configured so that said signal is insensitive to variations in angular rotation of said object at least about one of said two orthogonal directions.

14. The apparatus of claim 13 wherein said measurement path comprises at least one fold.

15. The apparatus of claim 13 further including means for receiving said signal and determining said altitude therefrom.

16. The apparatus of claim 13 wherein said object comprises a photolithographic translation stage for holding a wafer in an exposure position.

17. The interferometric apparatus of claim 16 further including a microlithographic means operatively associated with said interferometric apparatus for use in fabricating integrated circuits on a wafer, said microlithographic means comprising:
   at least one stage for supporting a wafer;
   an illumination system including a radiation source, a mask, a positioning system, a lens assembly, and predetermined portions of said interferometric apparatus,
   said microlithographic means being operative such that the source directs radiation through said mask to produce spatially patterned radiation, said positioning system adjusts the position of said mask relative to radiation from said source, said lens assembly images said spatially patterned radiation onto the wafer, and said interferometric apparatus measures the position of said mask relative to said radiation from said source.

18. The apparatus of claim 13 further comprising a second photolithographic translation stage mounted for movement with respect to said first photolithographic translation stage such that one of said photolithographic stages moves above the other and both move in orthogonal directions, said interferometer system being configured to measure the difference in altitudes from each of said stages to said datum line.

19. The interferometric apparatus of claim 13 wherein said interferometer system is configured in form selected from the group consisting of plane mirror and high stability plane mirror interferometers.

20. Interferometric apparatus for measuring changes in altitude between an object and a displaced reference body, said apparatus comprising:

means for defining an object mounted for nominally plane translation with respect to said displaced reference body in at least two orthogonal directions while experiencing relatively smaller changes in altitude in a direction nominally normal to said at least two orthogonal directions;

elongated reflector means fixedly mounted with respect to said object for movement therewith;

a source for generating an input beam that is parallel to said object plane of translation; and at least one interferometer system mounted at least in part on said displaced reference body, said interferometer system having a reference path and a measurement path which includes said elongated reflector means, said reference path being structured to be scanned by said input beam along a collection of points representing a reference datum line to provide a reference beam and said measurement path being adapted to provide a measurement beam that travels along said measurement path, to and from said elongated reflector means, scanning said elongated reflector means along a collection of points corresponding to those on said object datum line to define an object datum line associated with said object, said interferometer system being operative to provide a signal containing information that varies directly in accordance with only the distance between said object and said displaced reference body as said object moves, the distance between corresponding points of said datum lines at any location of said object with respect to said reference body corresponding directly to the altitude, said interferometer system being configured so that said signal is insensitive to variations in angular rotation of said object at least about one of said two orthogonal directions and such that said signal variation is decoupled from movement along at least one of said orthogonal directions.

21. The interferometric apparatus of claim 20 wherein said interferometer system comprises at least one multifaceted prism assembly fixedly mounted to said reference body and elongated in a direction nominally normal to the direction of propagation of said input beam.

22. The interferometric apparatus of claim 21 wherein said multifaceted prism assembly further comprises polarizing beam splitter layers located on selected ones of its facets.

* * * * *